(12) United States Patent
Lee

(10) Patent No.: US 10,468,449 B2
(45) Date of Patent: Nov. 5, 2019

(54) IMAGE SENSOR AND METHODS FOR FABRICATING THE SAME

(71) Applicant: SK hynix Inc., Gyeonggi-do (KR)

(72) Inventor: Cha-Young Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/606,095

(22) Filed: May 26, 2017

(65) Prior Publication Data

US 2018/0130834 A1 May 10, 2018

(30) Foreign Application Priority Data

Nov. 8, 2016 (KR) .................. 10-2016-0148054

(51) Int. Cl.
*H01L 27/146* (2006.01)
(52) U.S. Cl.
CPC .... *H01L 27/1463* (2013.01); *H01L 27/14683* (2013.01)
(58) Field of Classification Search
CPC .................................................. H01L 27/1462
USPC .......................................................... 257/446
See application file for complete search history.

(56) References Cited

U.S. PATENT DOCUMENTS

| 8,604,408 | B2* | 12/2013 | Yanagita | H01L 27/14603 250/214.1 |
| 9,337,230 | B2 | 5/2016 | Shinohara | |
| 9,825,075 | B2* | 11/2017 | Park | H01L 27/14605 |
| 2009/0140304 | A1* | 6/2009 | Kudoh | H01L 27/14603 257/292 |
| 2009/0189234 | A1* | 7/2009 | Mabuchi | H01L 27/14603 257/432 |
| 2010/0013975 | A1* | 1/2010 | Nakashima | H01L 27/14609 348/308 |
| 2010/0177226 | A1* | 7/2010 | Itonaga | H01L 27/14603 348/300 |
| 2011/0025892 | A1* | 2/2011 | Hibbeler | H01L 27/14609 348/294 |
| 2014/0054662 | A1* | 2/2014 | Yanagita | H01L 27/14643 257/291 |
| 2014/0232918 | A1* | 8/2014 | Shinohara | H01L 27/14623 348/308 |
| 2014/0239152 | A1* | 8/2014 | Chen | H01L 27/14605 250/208.1 |
| 2015/0102448 | A1* | 4/2015 | Sato | H01L 27/14634 257/446 |
| 2016/0093653 | A1* | 3/2016 | Tatani | H01L 27/14603 257/225 |

FOREIGN PATENT DOCUMENTS

KR 1020170109910 10/2017

* cited by examiner

*Primary Examiner* — Igwe U Anya
(74) *Attorney, Agent, or Firm* — IP & T Group LLP

(57) ABSTRACT

Disclosed is an image sensor, which includes a first PD isolation region for determining first to fourth PD regions, an FD isolation region formed between the first to fourth PD regions, and a floating diffusion formed in the FD isolation region. Horizontal distances from a perimeter of the floating diffusion to interfaces between the FD isolation region and the first to fourth PD regions are equal to each other.

15 Claims, 24 Drawing Sheets

IMAGE SENSOR AND METHODS FOR FABRICATING THE SAME

CROSS-REFERENCE TO RELATED APPLICATIONS

This U.S. non-provisional patent application claims priority under 35 U.S.C. § 119(a) to Korean Patent Application No. 10-2016-0148054, filed on Nov. 8, 2016, in the Korean Intellectual Property Office (KIPO), the disclosure of which is incorporated herein by reference in its entirety.

BACKGROUND

1. Field

Exemplary embodiments of the present disclosure relate to an image sensor and a method for fabricating the same, and more particularly, to an image sensor including a floating diffusion (FD) isolation region, and an image sensor forming method which includes an entire-surface ion implantation process and an FD isolation region forming process.

2. Description of the Related Art

Recently, with the development of information and communication technology and digitalization of electronic devices, image sensors having improved performance have been used in various fields of, for example, digital cameras, camcorders, portable phones, personal communication systems (PCSs), game machines, security cameras, and medical micro-cameras. Generally, an image sensor includes a pixel array including a plurality of unit pixels and a peripheral circuit region. A unit pixel typically includes a photodiode and a transfer transistor. The transfer transistor is disposed between the photodiode and a floating diffusion region to transfer charges generated by the photodiode to the floating diffusion region.

SUMMARY

Various embodiments are directed to an image sensor having an FD (floating diffusion) isolation region.

Also, various embodiments are directed to an image sensor forming method which includes an entire-surface ion implantation process and an FD isolation region forming process.

Other technical objects to be achieved by the present disclosure are not limited to the aforementioned objects, and other technical objects that have not been described above will become evident to those skilled in the art from the following description.

In an embodiment, a method for fabricating an image sensor may include forming an N-type doped region in a substrate, forming a PD isolation region to separate the N-type doped region into a plurality of PD regions in the substrate, forming an FD isolation region to be partially overlapped with the PD isolation region and the plurality of PD regions in the substrate, forming a plurality of transfer gates on the substrate, and forming a floating diffusion in the FD isolation region.

A P-type ion doping concentration of the PD isolation region may be higher than an N-type ion doping concentration of the N-type doped region.

A P-type ion doping concentration of the FD isolation region may be higher than a P-type ion doping concentration of the PD isolation region.

An N-type ion doping concentration of the floating diffusion may be higher than a P-type ion doping concentration of the FD isolation region.

The vertical depths of the PD isolation regions may be shorter than the vertical depth of the N-type doped region.

The method may further include forming a trench isolation region vertically overlapped with the FD isolation region.

In an embodiment, an image sensor may include a first PD isolation region suitable for determining first to fourth PD regions, an FD isolation region formed between the first to fourth PD regions, and a floating diffusion formed in the FD isolation region. Horizontal distances from a center of the floating diffusion to the first to fourth PD regions may be substantially equal to each other.

The first to fourth PD regions may include first doped N-type ions, and the first PD isolation regions include the first doped N-type ions and first doped P-type ions.

The doping concentration of the first doped N-type ions may be lower than the doping concentration of the first doped P-type ions.

The FD isolation region may include the first doped N-type ions, the first doped P-type ions, and second doped P-type ions.

The doping concentration of the second doped P-type ions may be higher than the doping concentration of the first doped P-type ions.

The floating diffusion may include the first doped N-type ions, the first doped P-type ions, second doped P-type ions, and second doped N-type ions.

The doping concentration of the second doped N-type ions may be higher than the doping concentration of the second doped P-type ions.

The image sensor may further include a second PD isolation region surrounding the first to fourth PD regions.

The image sensor may further include: first to fourth transfer gates overlapped with parts of the FD isolation region and parts of the first to fourth PD regions, respectively, on a top view; and a P-type doped region formed between the first to fourth transfer gates and the first to fourth PD regions.

The P-type doped region substantially may not include N-type ions.

In an embodiment, an image sensor may include a PD isolation region suitable for determining first to fourth PD regions, an FD isolation region formed between the first to fourth PD regions, and a floating diffusion formed in the FD isolation region. Horizontal distances from a perimeter of the floating diffusion to interfaces between the FD isolation region and the first to fourth PD regions may be substantially equal to each other.

Radial horizontal distances from a perimeter of the floating diffusion to the perimeter of the FD isolation region may be substantially equal to each other.

In an embodiment, an image sensor may include a PD isolation region suitable for determining first to fourth PD regions, an FD isolation region formed between the first to fourth PD regions, and a floating diffusion formed in the FD isolation region. First horizontal distances from a first interface between the floating diffusion and the FD isolation region to second interfaces between the FD region and the first to fourth PD regions may be substantially equal to each other.

Second horizontal distances from the first interface to third interfaces between the FD region and the first PD isolation region may be substantially equal to each other.

The first horizontal distances and the second horizontal distances may be substantially equal to each other.

The detailed contents of various embodiments are included in the detailed description and the drawings.

DETAILED DESCRIPTION

Figure 1:
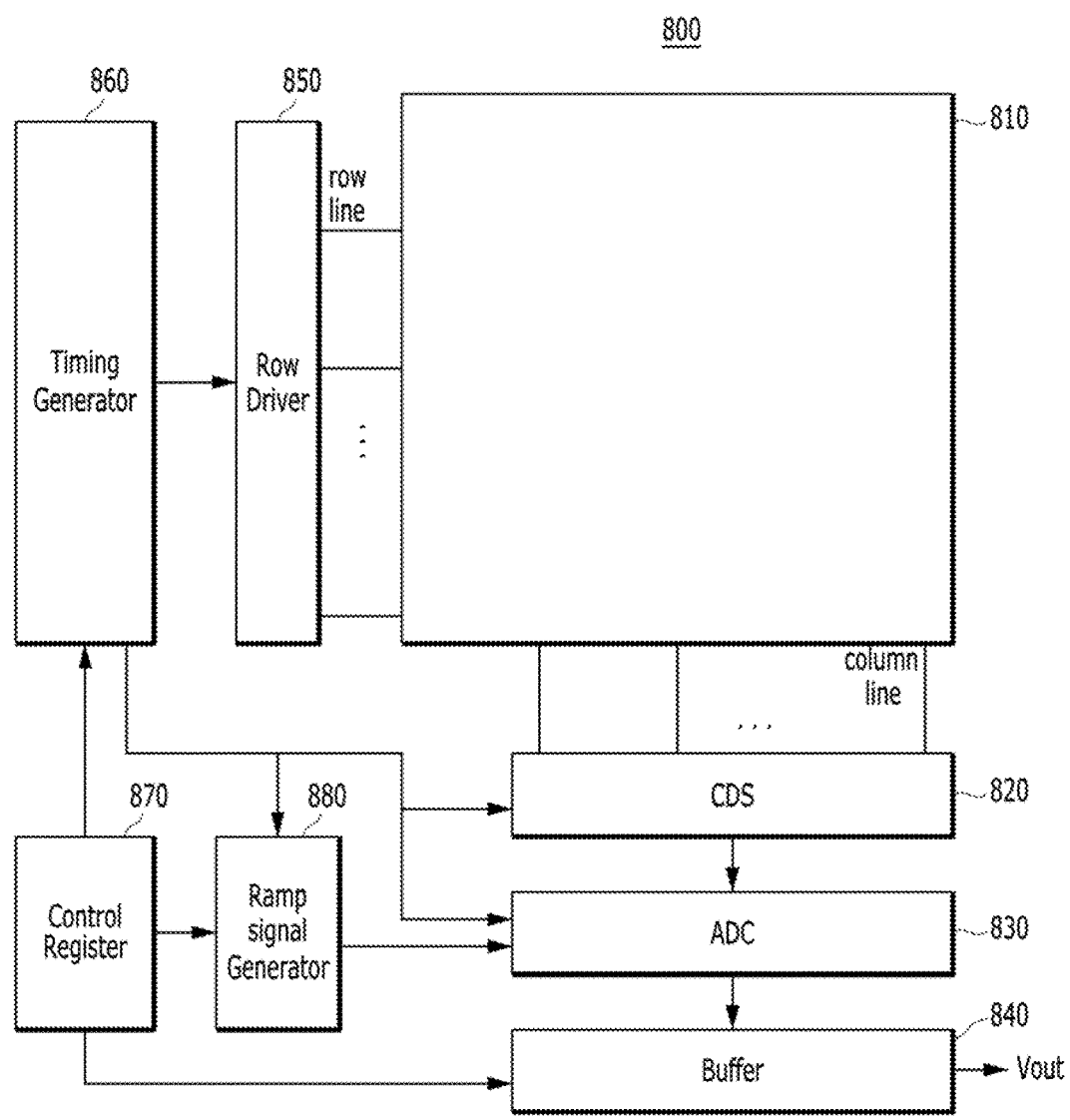
FIG. 1 is a block diagram illustrating the configuration of an image sensor in accordance with an exemplary embodiment of the present inventive concept.

Advantages and features of the present disclosure, and methods for achieving them will be apparent to those skilled in the art from the detailed description of the embodiments together with the accompanying drawings. However, the scope of the present disclosure is not limited to the embodiments disclosed in the specification, and the present disclosure can be realized in various other embodiments. The described present embodiments are presented only for completely disclosing the present disclosure and helping those skilled in the art to completely understand the scope of the present disclosure, and the present disclosure is defined only by the scope of the claims.

The terms used herein are just for describing specific embodiments and are not intended to limit the present disclosure. In this specification, a singular form may include a plural form as long as it is not specifically mentioned otherwise. The terms "comprises," "comprising," "includes," or "including" when used herein, specify the presence of components, steps, operations, and/or elements, but do not preclude the presence or addition of one or more other components, steps, operations, and/or elements.

It will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present. As used herein, the term "and/or" includes any and all combinations of one or more of the associated listed items.

Spatially relative terms, such as "below", "beneath", "lower", "above", "upper" and the like, may be used herein for ease of description to describe one element or component's relationship to another element(s) or component(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements would then be oriented "above" the other elements.

In addition, embodiments of the disclosure are described herein with reference to plane and cross-section illustrations that are schematic illustrations of idealized embodiments of the disclosure. In the drawings, the thicknesses of layers and regions may be exaggerated for effective description of inventive contents. As such, variations from the shapes of the illustrations as a result of, for example, manufacturing techniques and/or tolerances, are to be expected. Therefore, embodiments of the disclosure should not be construed as limited to the particular shapes illustrated herein but are to include deviations in shapes that result, for example, from manufacturing processes. For example, a region illustrated as a rectangle may have rounded or curved features. Thus, the regions illustrated in the figures are schematic in nature and their shapes are not intended to illustrate the actual shape of a region of a device and are not intended to limit the scope of the disclosure.

Throughout the specification and the drawings, the same components will be designated by like reference numerals. Therefore, although like reference numerals or similar reference numerals are not mentioned or described in a drawing, the various parts of the drawing may be described indirectly with reference to the other drawings.

The term of "equal to" may be interpreted as "substantially same" or "very similar" in the specification.

FIG. 1 is a block diagram illustrating the configuration of an image sensor 800 in accordance with an exemplary embodiment of the present inventive concept. Referring to FIG. 1, the image sensor 800 in accordance with an exemplary embodiment of the present inventive concept may include a pixel array 810 including a plurality of pixels which are arranged in the form of a matrix, a correlated double sampler (CDS) 820, an analog-to-digital converter (ADC) 830, a buffer 840, a row driver 850, a timing generator 860, a control register 870, and a ramp signal generator 880.

The pixel array 810 may include a plurality of pixels which are arranged in the form of a matrix. Each of the plurality of pixels may convert optical image information into an electrical image signal and transmit the electrical image signal to the correlated double sampler 820 through column lines. Each of the plurality of pixels may be coupled to one of the row lines and one of the column lines.

The correlated double sampler 820 may hold and sample electrical image signals received from the pixels of the pixel array 810. For example, the correlated double sampler 820 may sample the voltage levels of received electrical image signals and a reference voltage according to a clock signal applied from the timing generator 860, and transmit an analog signal corresponding to a difference therebetween to the analog-to-digital converter 830.

The analog-to-digital converter 830 may convert received analog signals into digital signals and transmit the digital signals to the buffer 840.

The buffer 840 may latch and output received digital signals to an image signal processing unit (not shown) in regular sequence. The buffer 840 may include a memory for latching the digital signals and a sense amplifier for amplifying the digital signals.

The row driver 850 may drive a plurality of pixels of the pixel array 810 according to a signal of the timing generator 860. For example, the row driver 850 may generate selection signals for selecting and/or driving signals for driving one row line among a plurality of row lines.

The timing generator 860 may generate timing signals for controlling the correlated double sampler 820, the analog-to-digital converter 830, the row driver 850 and the ramp signal generator 880.

The control register 870 may generate control signal for controlling the buffer 840, the timing generator 860 and the ramp signal generator 880.

The ramp signal generator 880 may generate a ramp signal for controlling an image signal outputted from the buffer 840 according to the control of the timing generator 860.

Figure 2A:
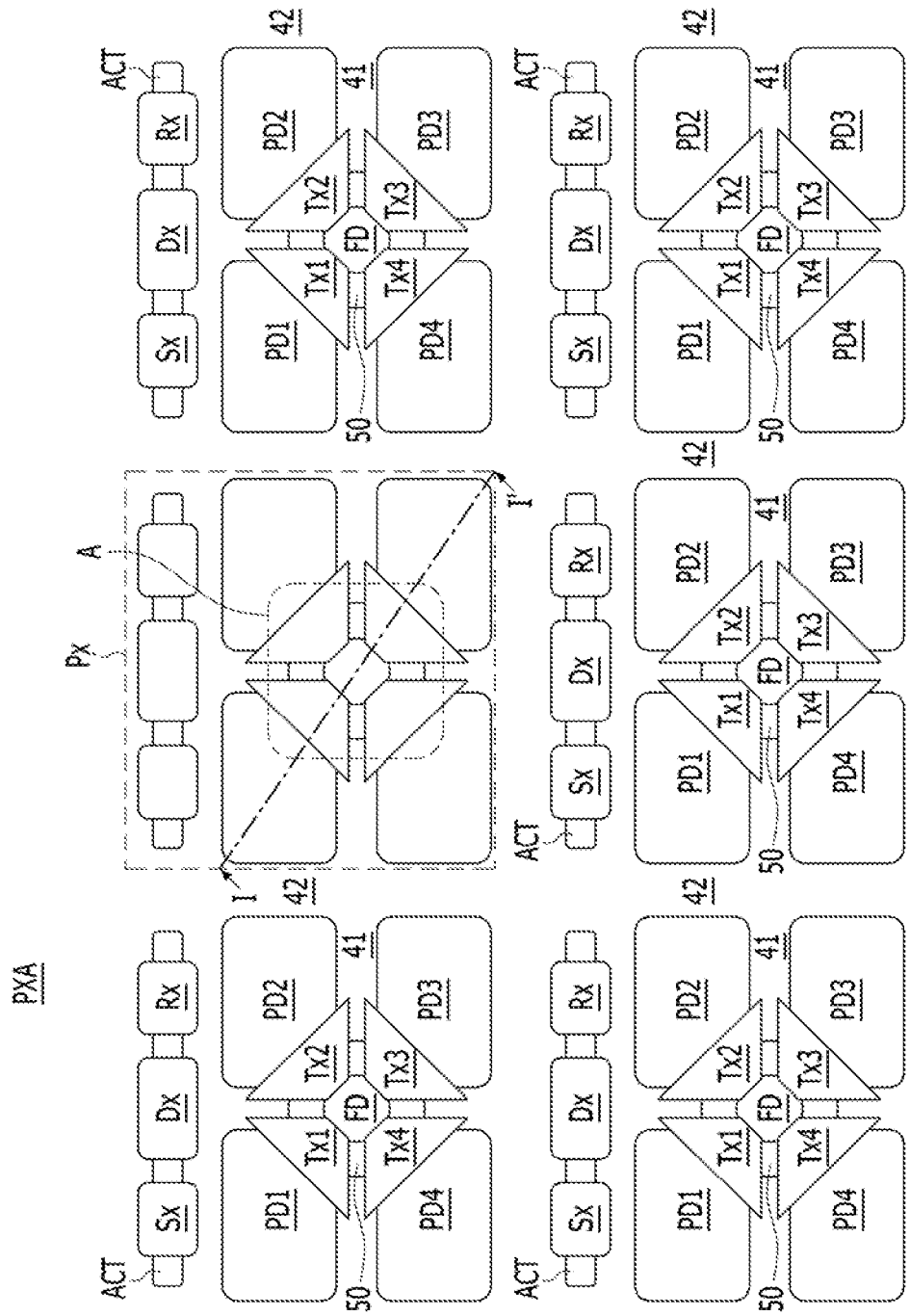
FIG. 2A is a schematic layout of a pixel array of an image sensor in accordance with an exemplary embodiment of the present disclosure.
Figure 2B:
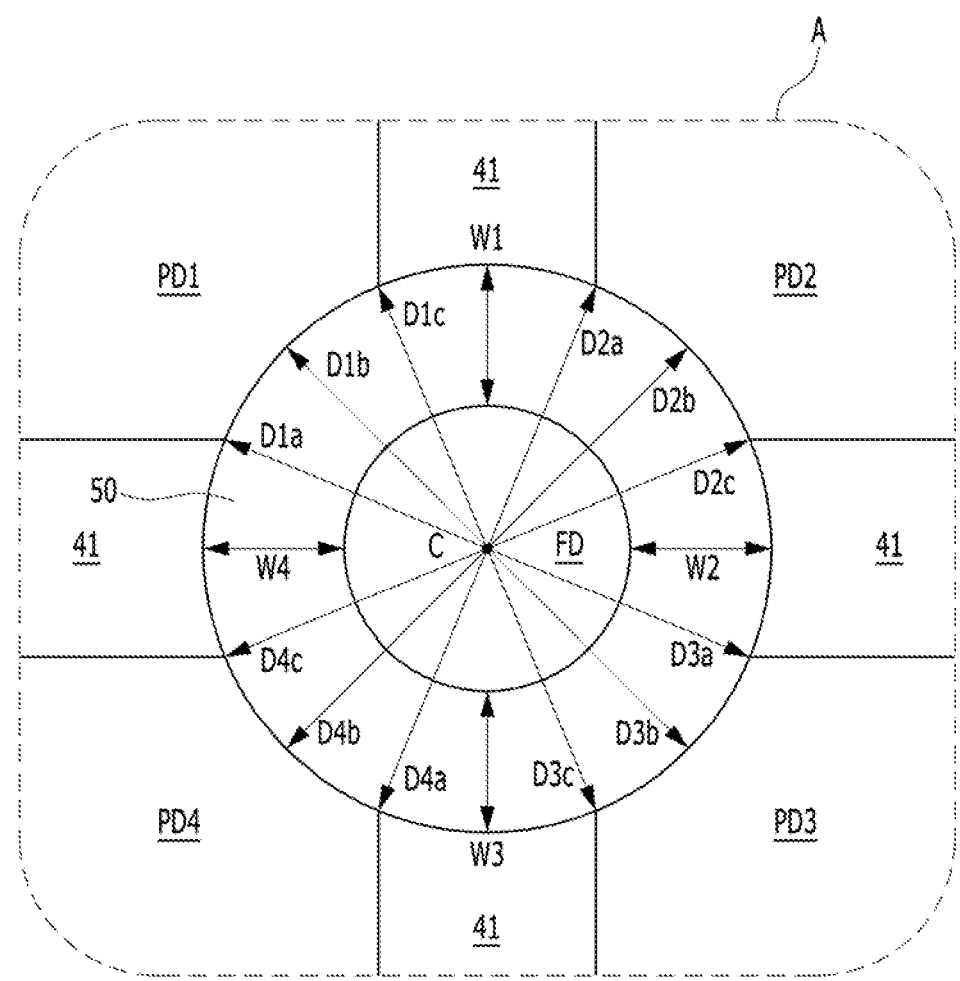
FIGS. 2B and 2C are enlarged views of a region of "A" shown in FIG. 2A.
Figure 2C:
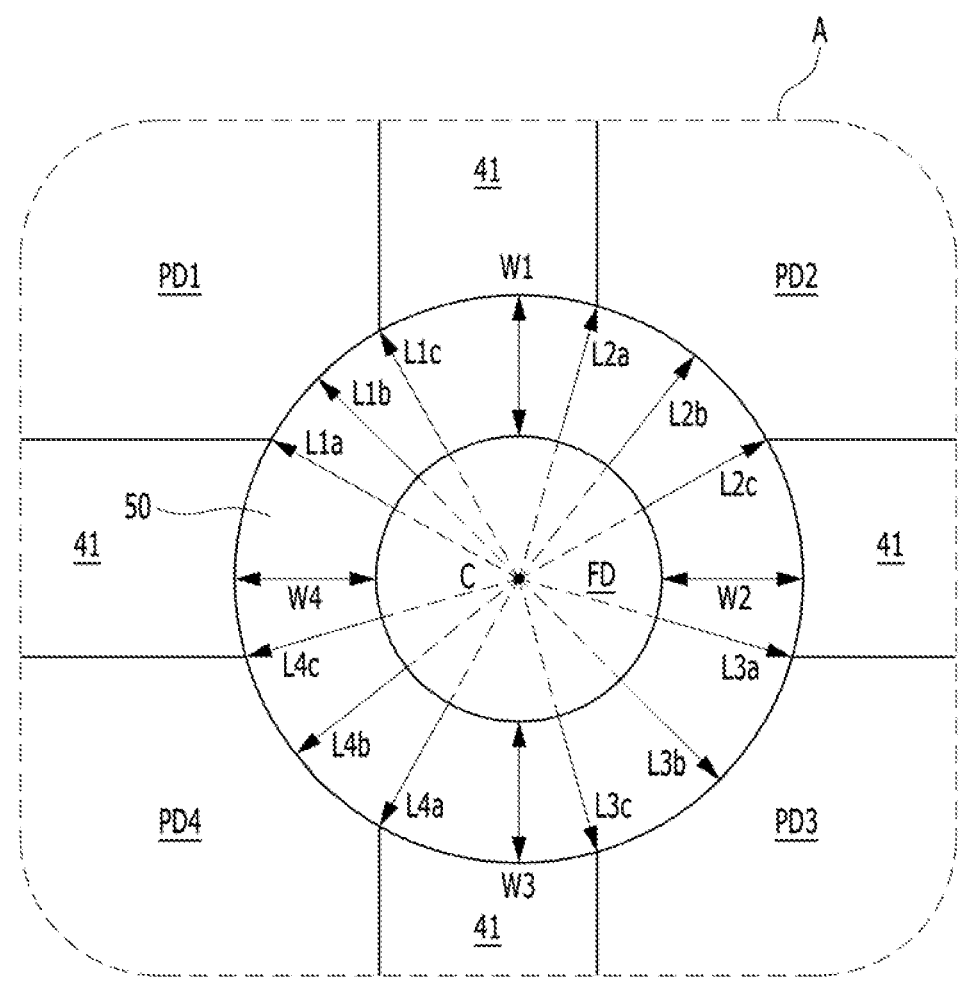

FIG. 2A is a schematic layout of a pixel array PXA of an image sensor in accordance with an exemplary embodiment of the present disclosure, and FIGS. 2B and 2C are enlarged views of a region of "A" shown in FIG. 2A.

Referring to FIG. 2A, the pixel array PXA of an image sensor in accordance with an exemplary embodiment of the present disclosure may include a plurality of unit pixels Px which are arranged in the form of a matrix.

Each unit pixel Px may include first to fourth PD regions PD1-PD4, central and peripheral PD isolation regions 41 and 42, first to fourth transfer gates Tx1-Tx4, an FD isolation region 50, a floating diffusion FD, an active region ACT, a selecting gate Sx, a driving gate Dx, and a reset gate Rx.

The first to fourth PD regions PD1-PD4 may be disposed in a radial form, centering around the floating diffusion FD and/or the FD isolation region 50. Therefore, the floating diffusion FD and the FD isolation region 50 may be overlapped with a part of the corners of the first to fourth PD regions PD1-PD4.

The first to fourth transfer gates Tx1-Tx4 also may be disposed in a radial form, centering around the floating diffusion FD and/or the FD isolation region 50. The first to fourth transfer gates Tx1-Tx4 may have a shape similar to a triangle or more precisely as illustrated in the embodiment of FIG. 2A an isosceles trapezoid, when viewed from the top. Therefore, each of the first to fourth transfer gates Tx1-Tx4 may be partially overlapped with the FD isolation region 50 and the first to fourth PD regions PD1-PD4.

The floating diffusion FD may be surrounded by the FD isolation region 50 and the transfer gates Tx1-Tx4. The four long sides of the floating diffusion FD may abut on the short bases of the first to fourth transfer gates Tx1-Tx4. The four short sides of the floating diffusion FD may abut on the FD isolation region 50.

The FD isolation region 50 may geometrically and electrically separate the first to fourth PD regions PD1-PD4 and the floating diffusion FD from each other. The first to fourth PD regions PD1-PD4 and the floating diffusion FD may be used as the source electrode or drain electrode of a transistor, and the FD isolation region 50 may provide the channel region of a transistor.

The active region ACT may be disposed to be spaced apart from the first to fourth PD regions PD1-PD4. The selecting gate Sx, the driving gate Dx, and the reset gate Rx may overlap parts of the active region ACT.

The central PD isolation region 41 may optically and electrically separate the first to fourth PD regions PD1-PD4 from each other. A part of the central PD isolation region 41 located at the center of the first to fourth PD regions PD1-PD4 may be overlapped with the floating diffusion FD and the FD isolation region 50.

The peripheral PD isolation region 42 may be disposed to surround the first to fourth PD regions PD1-PD4. Therefore, the respective unit pixels Px may be optically and electrically separated from each other by the peripheral PD isolation region 42. The peripheral PD isolation region 42 may be disposed between the first to fourth PD regions PD1-PD4 and the active region ACT. The central and peripheral PD isolation regions 41 and 42 may be configured to have the form of a lattice.

Referring to FIG. 2B, in an aligned state, the floating diffusion FD and the FD isolation region 50 may form the shape of concentric circles. The distances D1$a$-D4$c$ between the center C of the floating diffusion FD and the first to fourth PD regions PD1-PD4, respectively, may be substantially the same. The distances W1-W4 from the perimeter of the floating diffusion FD to the perimeter of the FD isolation region 50, respectively, may be substantially the same. To facilitate the description of the inventive concept of the present disclosure, the description of the first to fourth transfer gates Tx1-Tx4 is omitted in FIGS. 2B and 2C.

Referring to FIG. 2C, in a misaligned state, the floating diffusion FD and the FD isolation region 50 may form the shape of concentric circles. The distances L1$a$-L4$c$ from interfaces between the floating diffusion FD and the FD isolation region 50 to interfaces between the FD isolation region 50 and the first to fourth PD regions PD1-PD4, respectively, may be substantially the same.

According to the inventive concept of the present disclosure, in an aligned state in which the floating diffusion FD, the FD isolation region 50 and the first to fourth PD regions PD1-PD4 are aligned, the lengths of the channels of the first to fourth transfer gates Tx1-Tx4, i.e., the distances from the floating diffusion FD to the first to fourth PD regions PD1-PD4, may be substantially uniform.

According to the inventive concept of the present disclosure, in a misaligned state in which the floating diffusion FD, the FD isolation region 50 and the first to fourth PD regions PD1-PD4 are misaligned, the lengths of the channels of the first to fourth transfer gates Tx1-Tx4 may be similar to each other.

Accordingly, the transfer characteristics of the first to fourth transfer gates Tx1-Tx4 can be uniform, and the optical characteristic of the image sensor can be stable.

Figure 3A:
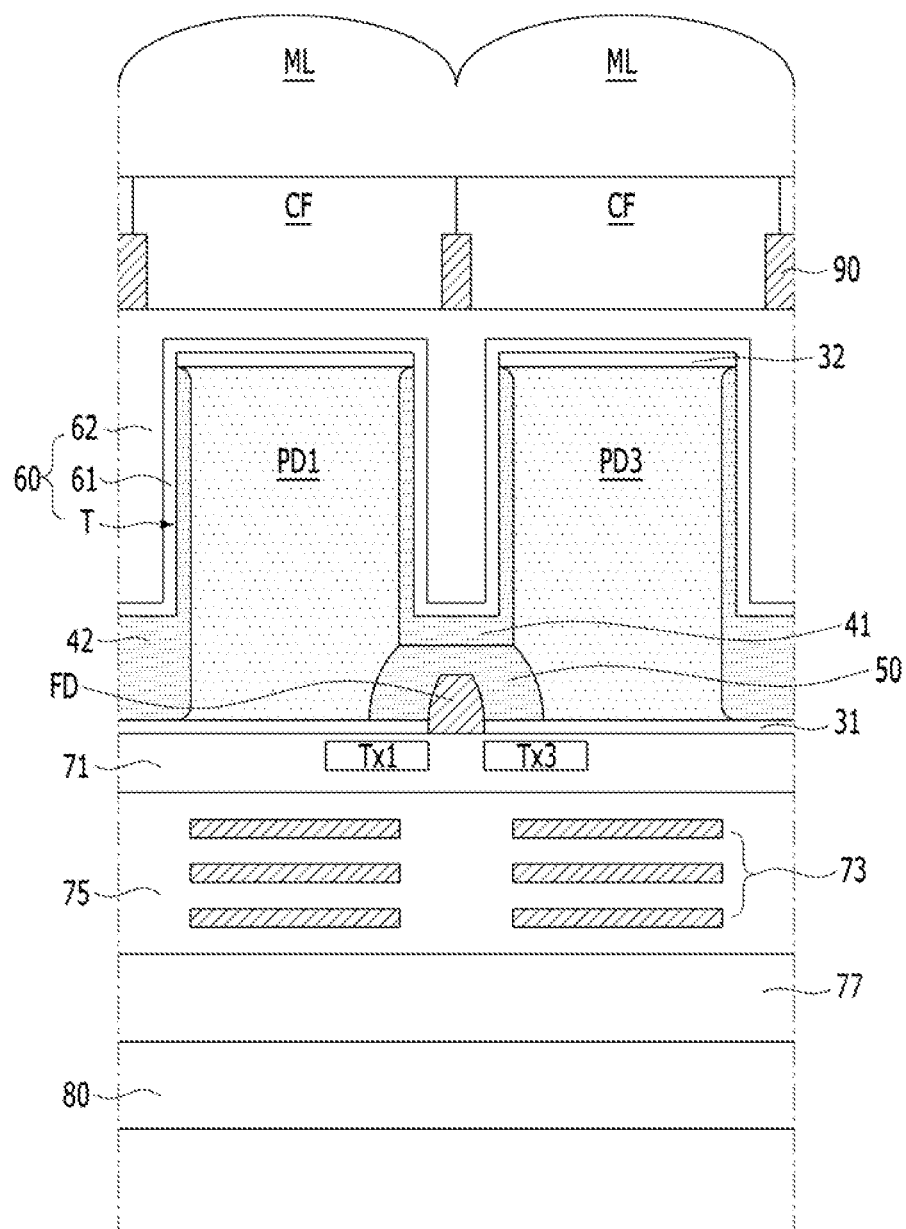
FIGS. 3A to 3C are schematic longitudinal sectional views taken along line I-I' in FIG. 2A for explaining image sensors in accordance with exemplary embodiments of the present disclosure.
Figure 3B:
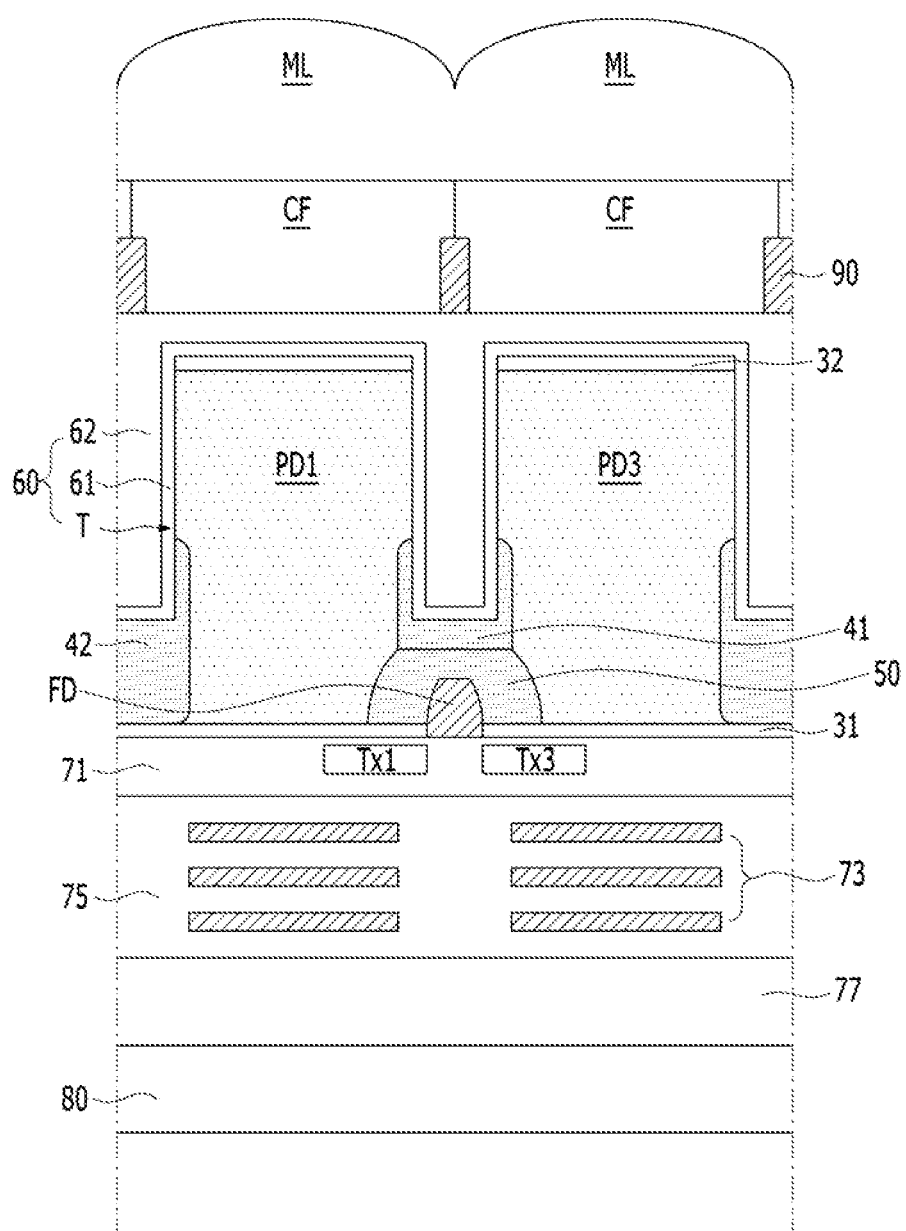
Figure 3C:
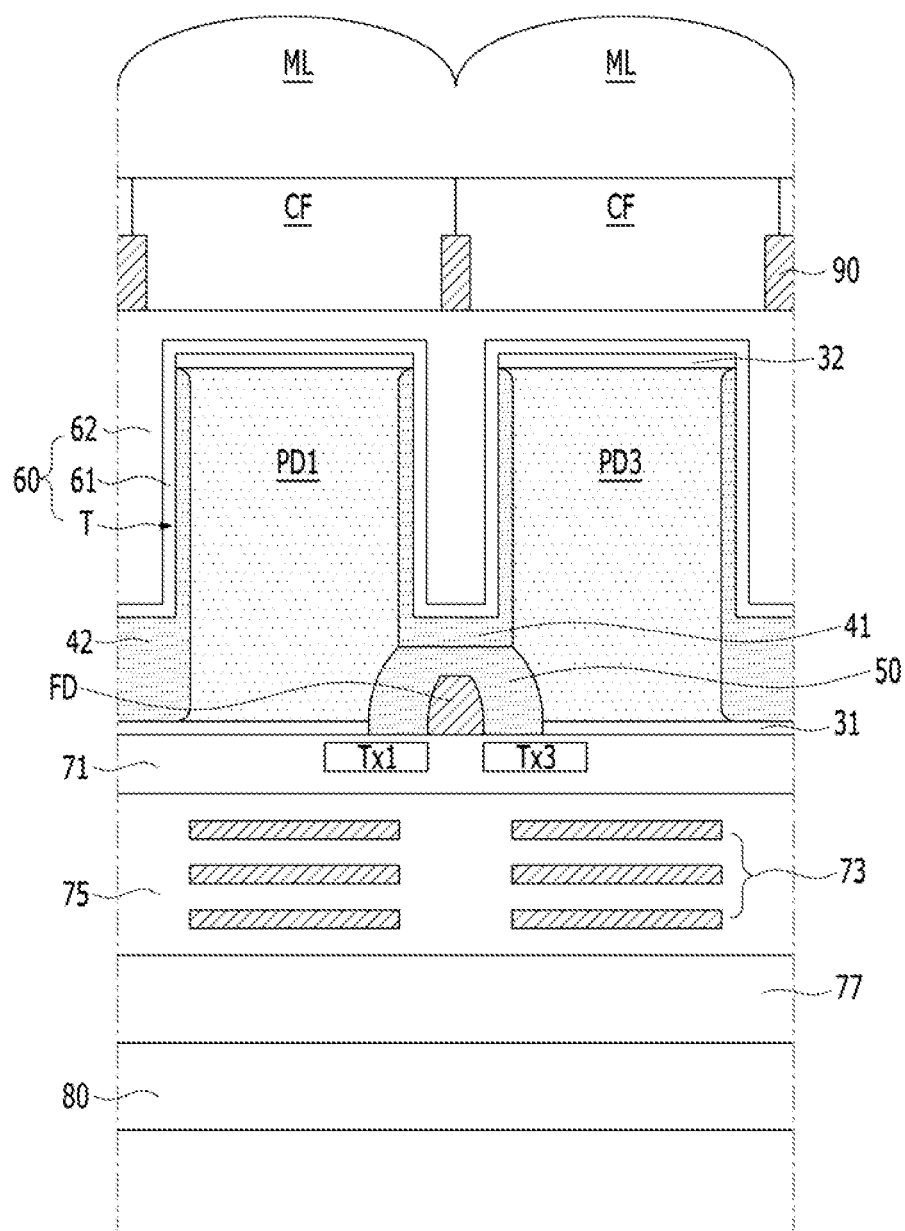

FIGS. 3A to 3C are conceptual longitudinal sectional views taken along line I-I' in FIG. 2A for explaining image sensors in accordance with exemplary embodiments of the present disclosure.

Referring to FIGS. 2A, 2B and 3A, the image sensor in accordance with an exemplary embodiment of the present disclosure may include the first to fourth PD regions PD1-PD4, first and second P-type doped regions 31 and 32, the central and peripheral PD isolation regions 41 and 42, the FD isolation region 50, the floating diffusion FD, deep trench isolation regions 60, the first to fourth transfer gates Tx1-Tx4, a lower interlayer insulating layer 71, a metal wiring layer 73, an upper interlayer insulating layer 75, a capping insulating layer 77, a support substrate 80, grid patterns 90, color filters CF, and micro-lenses ML.

The first to fourth PD regions PD1-PD4 may be N-type doped regions which include N-type ions implanted into a silicon substrate. More specifically, the first to fourth PD regions PD1-PD4 may have all of doped N-type ions and doped P-type ions. In the first to fourth PD regions PD1-

PD4, the doping concentration of the N-type ions may be relatively and sufficiently higher than the doping concentration of the P-type ions.

The first P-type doped region 31 may be formed on the lower portions of the first to fourth PD regions PD1-PD4. The first P-type doped region 31 may include P-type ions such as boron (B). The first P-type doped region 31 may be formed between the first to fourth PD regions PD1-PD4 and the lower interlayer insulating layer 71, between the FD isolation region 50 and the first to fourth transfer gates Tx1-Tx4, between the first to fourth PD regions PD1-PD4 and the first to fourth transfer gates Tx1-Tx4, and between the peripheral PD isolation region 42 and the lower interlayer insulating layer 71. The first P-type doped region 31 may continuously extend in a horizontal direction to surround a portion of the sides of the floating diffusion FD in a top view. The first to fourth PD regions PD1-PD4 and the first P-type doped region 31 may form respective photodiodes.

The second P-type doped region 32 may be formed to cover the upper surfaces of the respective first to fourth PD regions PD1-PD4. The second P-type doped region 32 is substantially aligned perpendicularly with the respective first to fourth PD regions PD1-PD4.

The central PD isolation region 41 may be formed between the first to fourth PD regions PD1-PD4. As described above, the first to fourth PD regions PD1-PD4 may be optically and electrically separated from each other by the central PD isolation region 41. The peripheral PD isolation region 42 may surround the first to fourth PD regions PD1-PD4. The central and peripheral PD isolation regions 41 and 42 may have substantially the same vertical depth or length as the first to fourth PD regions PD1-PD4. The central PD isolation region 41 and the peripheral PD isolation region 42 may have all of doped P-type ions and doped N-type ions. In the central PD isolation region 41 and the peripheral PD isolation region 42, the doping concentration of the P-type ions may be relatively and sufficiently higher than the doping concentration of the N-type ions. That is to say, the P-type ion doping concentration of the central and peripheral PD isolation regions 41 and 42 may be sufficiently higher than the N-type ion doping concentration of the first to fourth PD regions PD1-PD4. For example, the P-type ion doping concentrations of the central PD isolation region 41 and peripheral PD isolation region 42 may be sufficiently higher than the N-type ion doping concentration of the first to fourth PD regions PD1-PD4.

The deep trench isolation regions 60 may include a lining insulating layer 61 conformably formed on the bottom surface and inner walls of a deep trench T, and a filling insulating layer 62 with which the deep trench T is filled. The deep trench T may be formed conformally over the central and peripheral PD isolation regions 41 and 42 and may extend in a substantially perpendicular direction. For example, on a top view, the deep trench T may be defined substantially within the central and peripheral PD isolation regions 41 and 42. The lining insulating layer 61 may include a metallic oxide such as a hafnium oxide (HfO). The filling insulating layer 62 may include a silicon oxide.

The FD isolation region 50 may be formed on the lower horizontal portion of the central PD isolation region 41. That is to say, the FD isolation region 50 may be formed between the first to fourth PD regions PD1-PD4 to overlap perpendicularly to the central PD isolation region 41. The FD isolation region 50 may include all of doped P-type ions and doped N-type ions. In the FD isolation region 50, the doping concentration of the P-type ions may be relatively and sufficiently higher than the doping concentration of the N-type ions. The P-type ion doping concentration of the FD isolation region 50 may be higher than the P-type ion doping concentrations of the central PD isolation region 41 and peripheral PD isolation region 42.

The floating diffusion FD may be partially surrounded by the FD isolation region 50. Specifically, the top surface and lateral surfaces of the floating diffusion FD may be surrounded by the FD isolation region 50. The bottom surface of the floating diffusion FD may be covered by the lower interlayer insulating layer 71. The floating diffusion FD may include all of doped N-type ions and doped P-type ions. In the floating diffusion FD, the doping concentration of the N-type ions may be relatively and sufficiently higher than the doping concentration of the P-type ions. For example, the N-type ion doping concentration of the floating diffusion FD may be sufficiently higher than the P-type ion doping concentration of the FD isolation region 50.

The first to fourth transfer gates Tx1-Tx4 may be formed to overlap with parts of the FD isolation region 50 and parts of the first to fourth PD regions PD1-PD4 on the first P-type doped region 31. The lateral surfaces of the first to fourth transfer gates Tx1-Tx4 may be arranged to extend substantially in the perpendicular direction. The inner lateral surfaces of the transfer gates Tx1-Tx4 may be substantially aligned with the lateral surface of the floating diffusion FD.

The lower interlayer insulating layer 71, the upper interlayer insulating layer 75 and the capping insulating layer 77 may include a silicon oxide, and the metal wiring layer 73 may include metal.

The support substrate 80 may include a silicon wafer which has a silicon oxide formed thereon.

The grid patterns 90 may be formed over the top surface of the filling insulating layer of the deep trench isolation region 60 to substantially align perpendicularly to the central and peripheral PD isolation regions 41 and 42. The grid patterns 90 may be formed to have the shape of a lattice on a top view that defines color filter regions CF which are aligned perpendicularly with the PD regions PD1 to PD4. The grid patterns 90 may include a metal such as tungsten to be optically opaque. Accordingly, the grid patterns 90 can ensure that the first to fourth PD regions PD1-PD4 can be optically exposed independently.

The color filters CF may be formed over the first to fourth PD regions PD1-PD4 and may be separated by the grid patterns 90. The micro-lenses ML may be formed to be perpendicularly aligned with the color filters CF.

The first to fourth PD regions PD1-PD4, the first and second doped regions 31 and 32, the central and peripheral PD isolation regions 41 and 42, and the floating diffusion FD may be regions into which ions have been implanted in a silicon wafer. That is to say, the first to fourth PD regions PD1-PD4, the first and second doped regions 31 and 32, the central and peripheral PD isolation regions 41 and 42, and the floating diffusion FD may be parts, respectively, of a silicon substrate.

Referring to FIGS. 2A, 2B and 3B, the image sensor in accordance with another exemplary embodiment of the present disclosure may include a relatively shorter central and peripheral PD isolation regions 41 and 42, as compared with those in the image sensor shown in FIG. 3A. Specifically, the central and peripheral PD isolation regions 41 and 42 may have depths or lengths substantially shorter than those of the first to fourth PD regions PD1-PD4.

Referring to FIGS. 2A, 2B and 3C, the image sensor in accordance with yet another exemplary embodiment of the present disclosure may include an FD isolation region 50 formed to be near by or to be in contact with the lower surfaces of the first to fourth transfer gates Tx1-Tx4. Therefore, the first P-type doped region 31 may be horizontally discontinuous.

The features of the image sensors shown in FIGS. 3A to 3C may be combined with each other.

Figure 4:
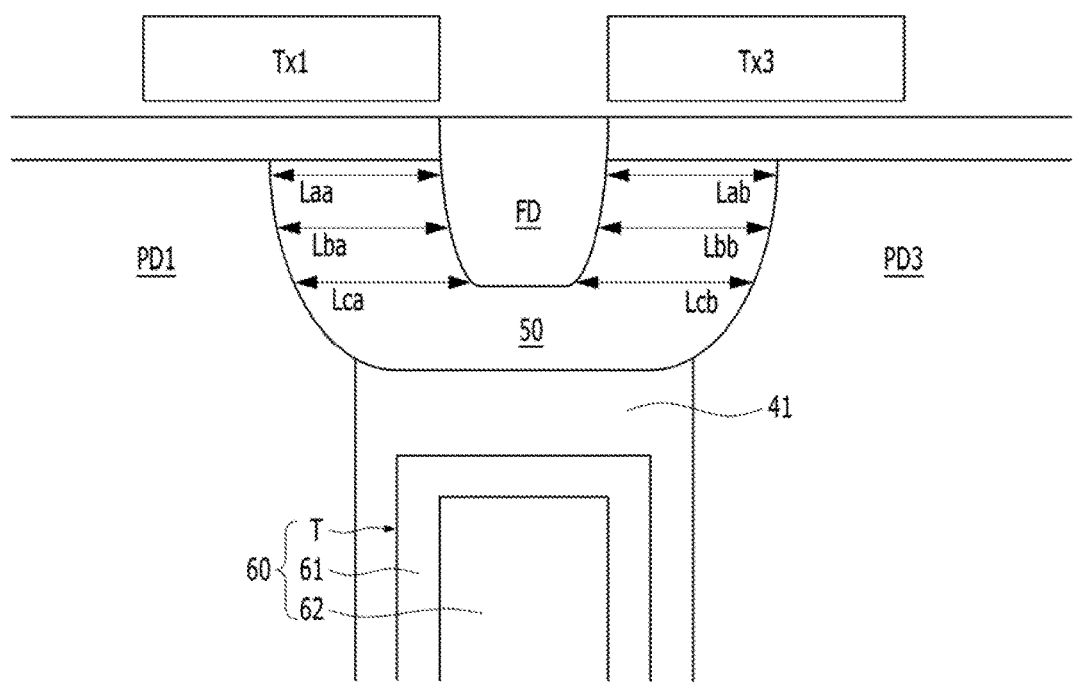
FIG. 4 is an enlarged longitudinal sectional view of image sensors in accordance with various exemplary embodiments of the present disclosure, taken along line I-I' in FIG. 2A.

FIG. 4 is an enlarged longitudinal sectional view of image sensors in accordance with various embodiments of the present disclosure, taken along line I-I' in FIG. 2A. For example, parts of the image sensors shown in FIGS. 3A to 3C are turned over and enlarged. Hatching is omitted for easy understanding of the figure. Referring to FIG. 4, in an aligned state, horizontal distances Laa, Lab, Lba, Lbb, Lca, Lcb in each equal same depth from the perimeter of the floating diffusion FD to interfaces between the FD isolation region 50 and the first to fourth PD regions PD1-PD4 may be substantially the same as each other (Laa=Lab, Lba=Lbb, Lca=Lcb).

FIGS. 5A to 5J are conceptual longitudinal sectional views taken along line I-I' in FIG. 2A in order to explain a method for forming an image sensor in accordance with an exemplary embodiment of the present disclosure.

Figure 5A:
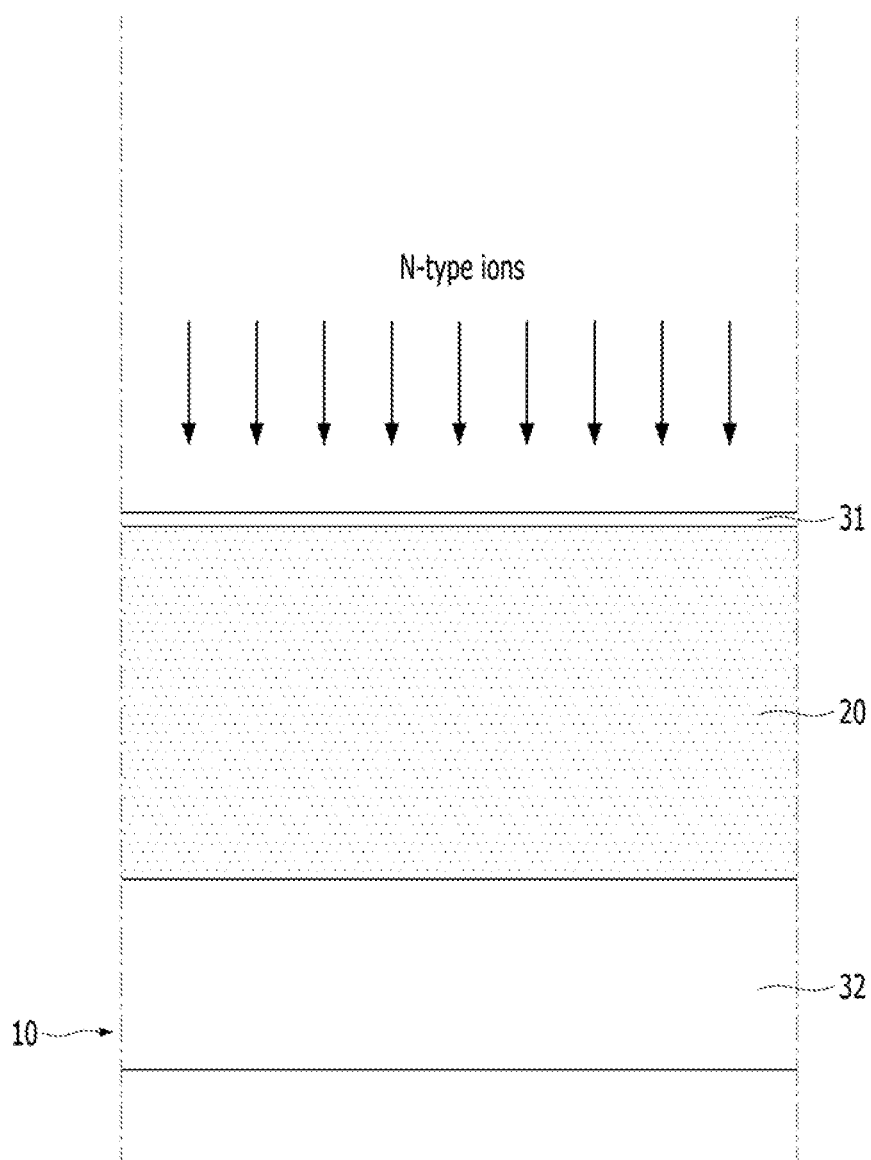
FIGS. 5A to 5J, FIGS. 6A to 6C, and FIGS. 7A and 7B are schematic longitudinal sectional views taken along line I-I' in FIG. 2A in order to explain methods for forming image sensors in accordance with various embodiments of the present disclosure.

Referring to FIG. 5A, a method for forming an image sensor in accordance with an exemplary embodiment of the present disclosure may include forming an N-type doped region 20 in a substrate 10. The substrate 10 may be a single crystal silicon wafer or an epitaxial-grown single crystal silicon wafer including P-type ions such as boron (B). That is to say, the substrate 10 may be a P-type semiconductor. The forming of the N-type doped region 20 may include performing a process of blanket-implanting N-type ions, such as phosphorous (P) or arsenic (As), into the substrate 10 on the whole. That is to say, the N-type ion implantation process can be performed, without forming a mask pattern for ion implantation on the substrate 10. Therefore, the N-type doped region 20 may be formed in the form of a continuous bulk, without being separated. The N-type doped region 20 may be separated from the surface of the substrate 10. Therefore, a first P-type doped region 31 may be defined between the upper surface of the N-type doped region 20 and the upper surface of the substrate 10, and a second P-type doped region 32 may be defined between the lower surface of the N-type doped region 20 and the lower surface of the substrate 10. The second P-type doped region 32 may have a larger vertical thickness and a larger volume than the first P-type doped region 31. The first P-type doped region 31 and the N-type doped region 20 may form a photodiode. Since formed in a bulk shape, the N-type doped region 20 can have entirely a uniform ion concentration. That is to say, the photodiodes of pixels can have entirely a uniform characteristic.

Figure 5B:
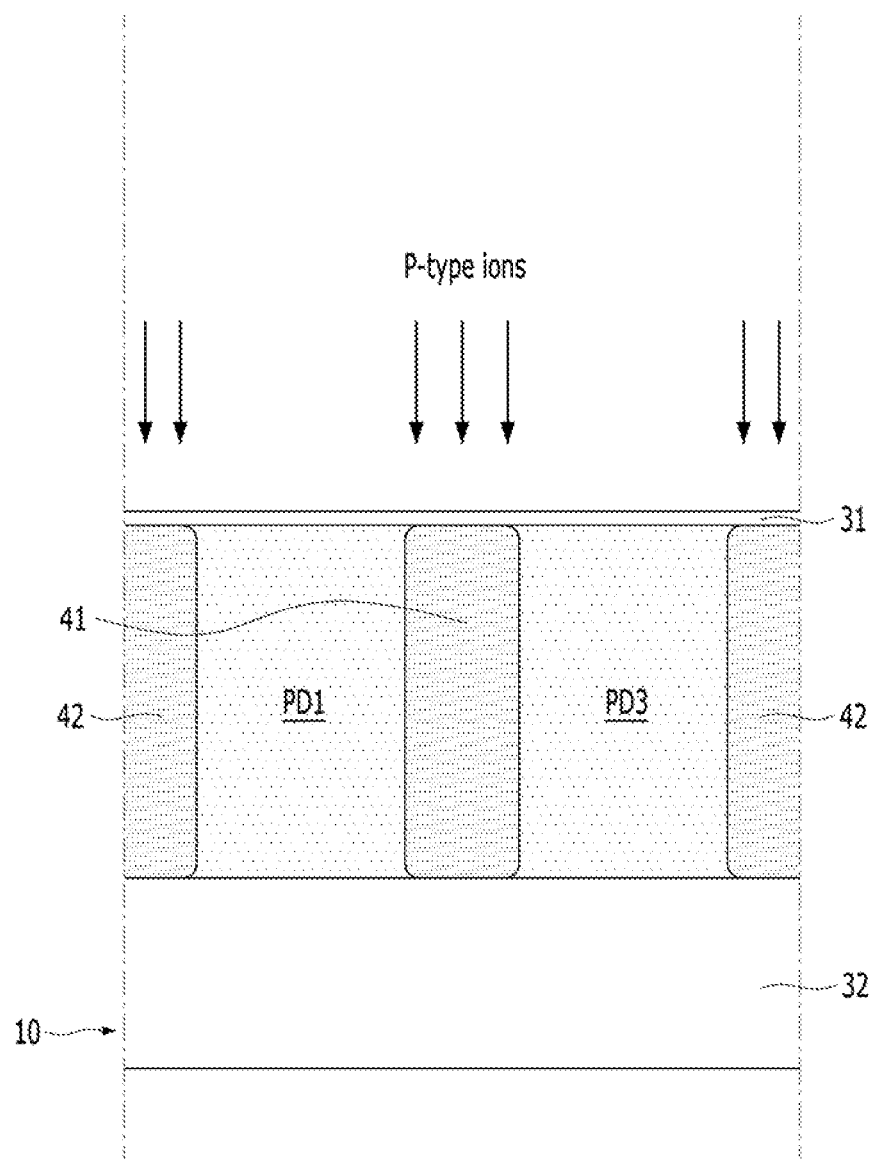

Referring to FIG. 5B, the method may include forming a plurality of PD isolation regions 41 and 42 in the substrate 10. The forming of the PD isolation regions 41 and 42 may include performing a process of implanting P-type ions into the N-type doped region 20 of the substrate 10. Referring FIG. 2, the N-type doped region 20 may be separated to a plurality of PD regions PD1-PD4 by the PD isolation regions 41 and 42. The PD isolation regions 41 and 42 may include a central PD isolation region 41 and a peripheral PD isolation region 42. Referring again to FIG. 2A, the central PD isolation region 41 may be disposed between the first to fourth PD regions PD1-PD4 to optically and electrically separate the first to fourth PD regions PD1-PD4 from each other, and the peripheral PD isolation region 42 may be disposed to surround the outer line of the first to fourth PD regions PD1-PD4. That is to say, the peripheral PD isolation region 42 may be disposed between unit pixels Px to optically and electrically separate the unit pixels Px. The vertical depths or vertical lengths of the PD isolation regions 41 and 42 may be substantially similar to those of the N-type doped region 20. Since the respective PD regions PD1-PD4 are defined without a separate arrangement process, the respective PD regions PD1-PD4 can have maximized volumes.

Figure 5C:
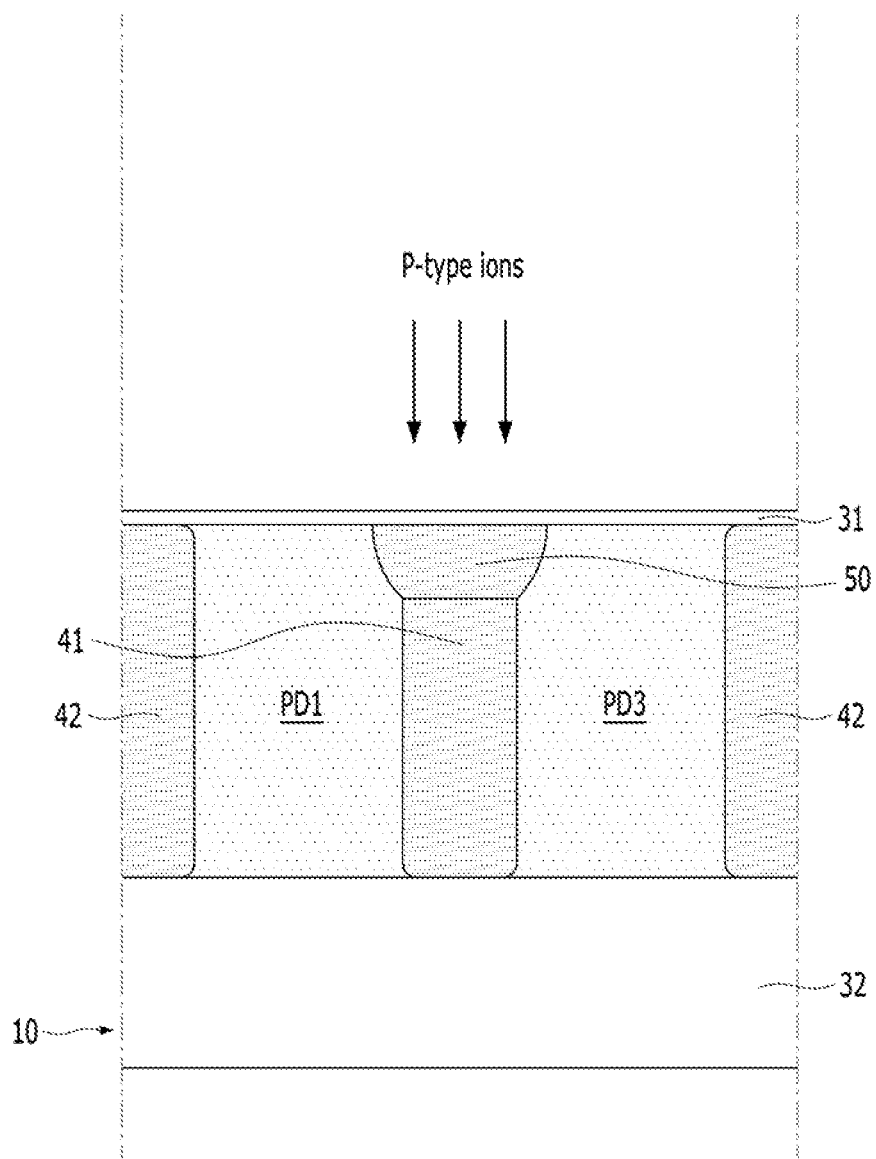

Referring to FIG. 5C, the method may include forming the FD isolation region 50 in the substrate 10. The forming of the FD isolation region 50 may include performing a process of implanting P-type ions into the substrate 10 to be overlapped with the upper portion of the central PD isolation region 41. The FD isolation region 50 may have a higher ion concentration than the central PD isolation region 41. Referring again to FIG. 2A, the FD isolation region 50 may be partially overlapped with the corner portions of the first to fourth PD regions PD1-PD4. The FD isolation region 50 may be not formed on the upper portion of the peripheral PD isolation region 42.

Figure 5D:
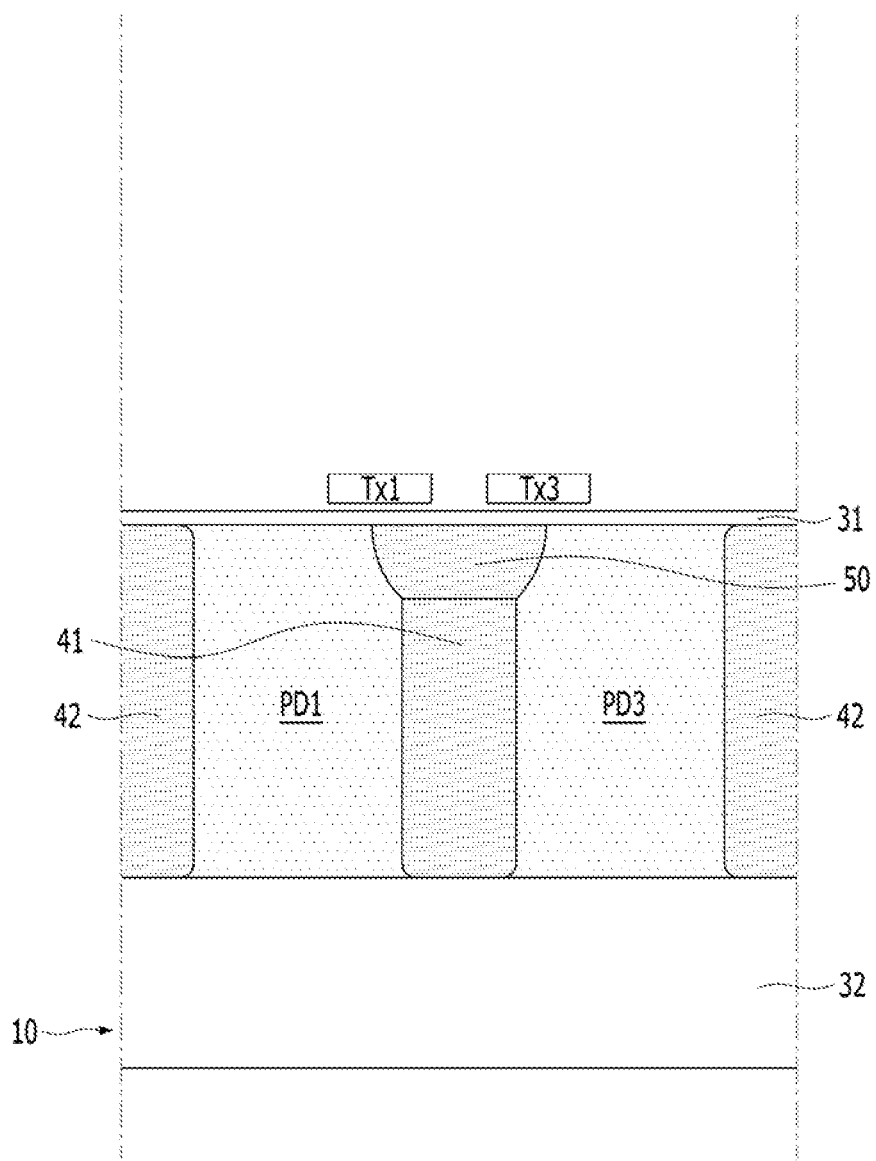

Referring to FIG. 5D, the method may include forming the transfer gates Tx1-Tx4. Referring again to FIG. 2A, the transfer gates Tx1-Tx4 may be overlapped vertically with parts of the first to fourth PD regions PD1-PD4 and parts of the FD isolation region 50, respectively.

Figure 5E:
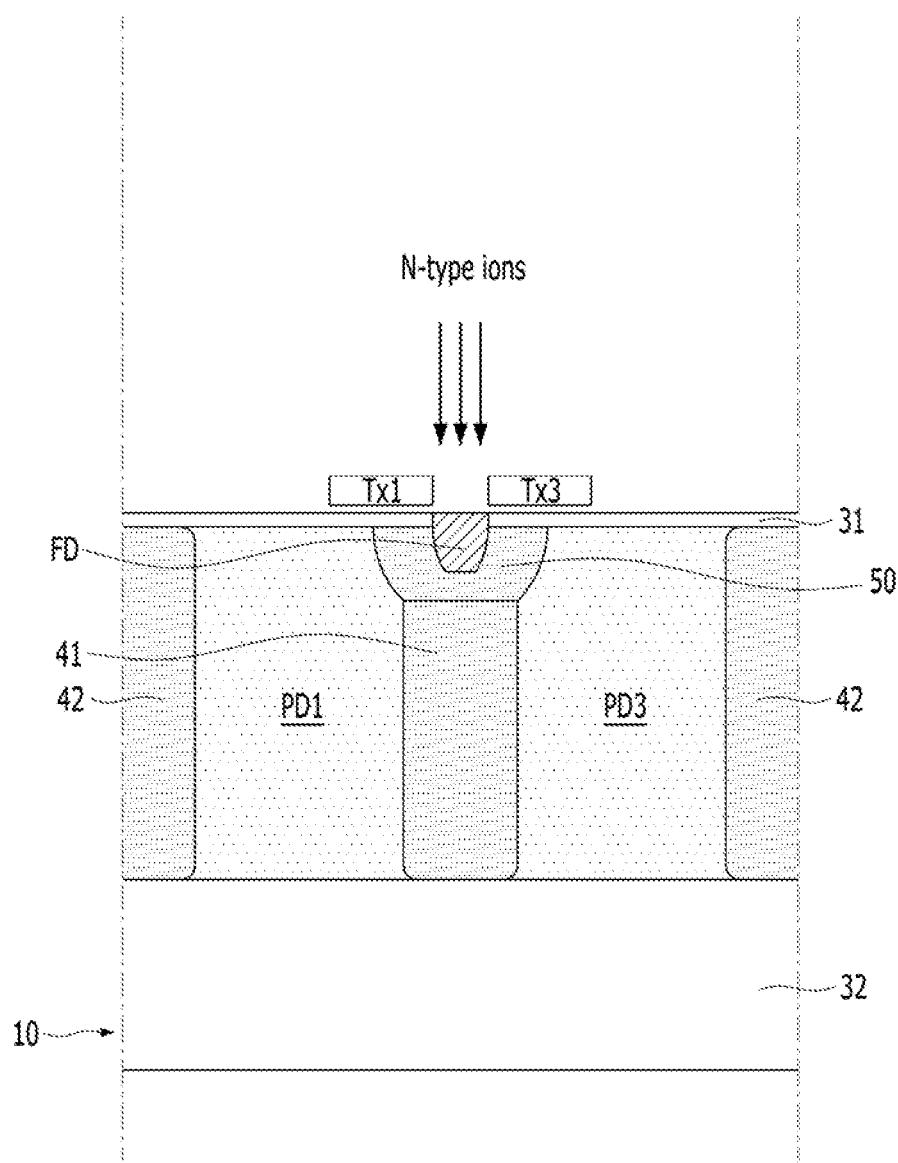

Referring to FIG. 5E, the method may include forming the floating diffusion FD in the FD isolation region 50 of the substrate 10. The floating diffusion FD may be centrally aligned with the FD isolation region 50. The forming of the floating diffusion FD may include implanting N-type ions into the FD isolation region 50 of the substrate 10. The FD isolation region 50 may surround the lower surface and lateral surfaces of the floating diffusion FD. The lateral surface of the floating diffusion FD may be arranged to align perpendicularly to the inner lateral surfaces of the transfer gates Tx1-Tx4. The FD isolation region 50 may provide a channel region of a transfer transistor. Accordingly, since the channel regions of the respective transfer gates Tx1-Tx4 can have a uniform channel length, a lag phenomenon can be reduced.

Figure 5F:
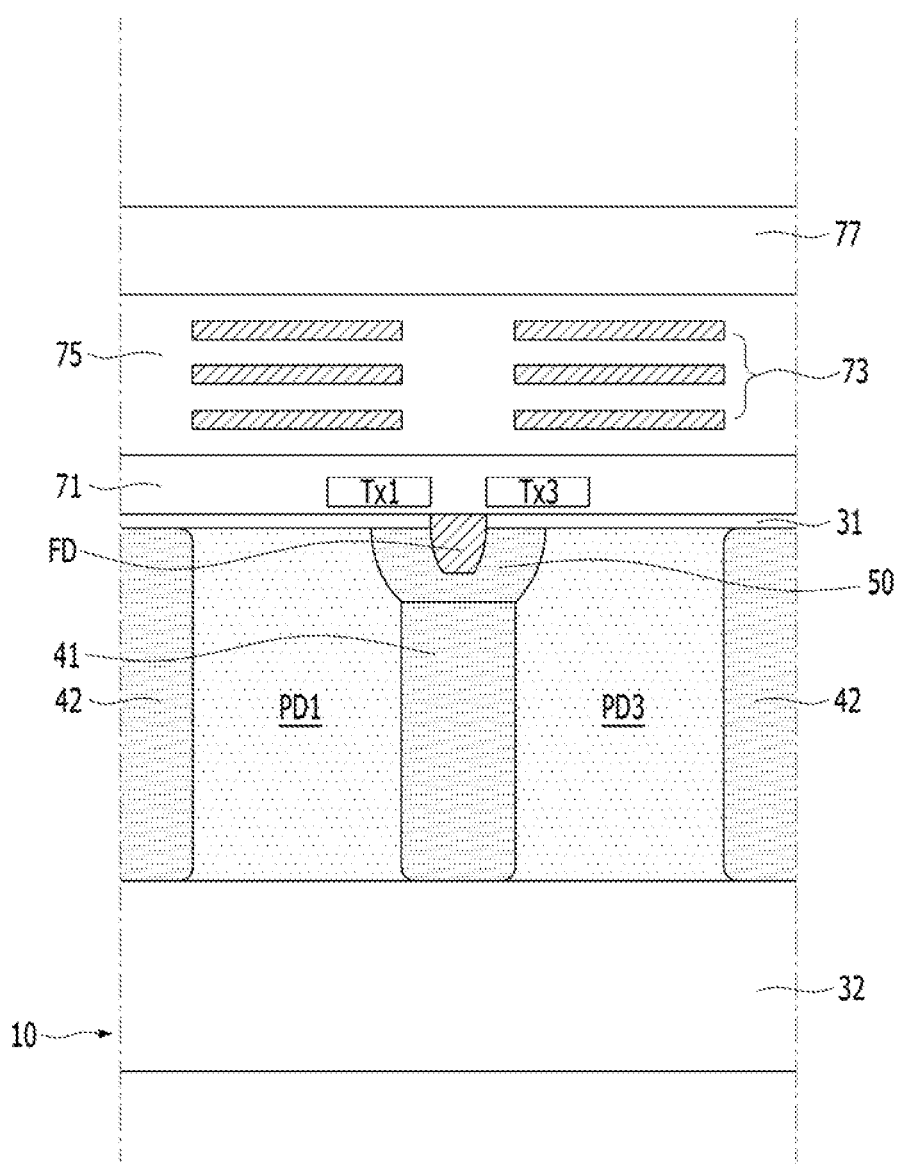

Referring to FIG. 5F, the method may include forming a lower interlayer insulating layer 71 on the substrate 10. The lower interlayer insulating layer 71 covers the transfer gates Tx1-Tx4, the top surface of the floating diffusion FD, and the lower P-type doped region 31. The method further includes forming a metal wiring layer 73 and an upper interlayer insulating layer 75 on the lower interlayer insulating layer 71, and forming a capping insulating layer 77 on the upper interlayer insulating layer 75. The lower interlayer insulating layer 71, the upper interlayer insulating layer 75 and the capping insulating layer 77 may include a silicon oxide, such as a tetra ethyl ortho silicate (TEOS) or high density plasma (HDP) oxide. The metal wiring layer 73 may include: a metal, such as tungsten (W), titanium (Ti), copper (Cu) or aluminum (Al); a metallic compound, such as a tungsten nitride or a titanium nitride; or a metallic silicide.

Figure 5G:
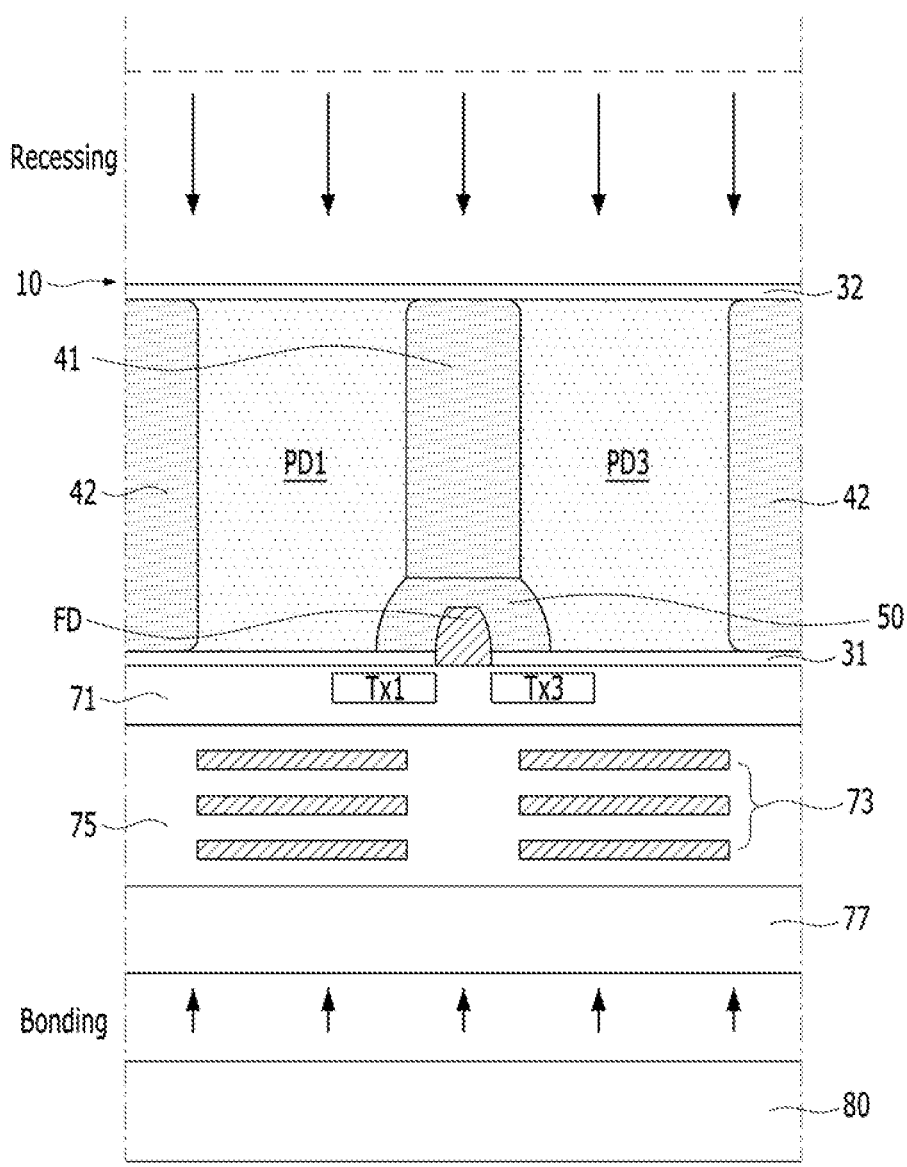

Referring to FIG. 5G, the method may include turning over the substrate 10, bonding a support substrate 80 on the capping insulating layer 77, and recessing the upper surface of the substrate 10. The recessing of the upper surface of the substrate 10 may include performing a process, such as grinding or a dry plasma etching.

Figure 5H:
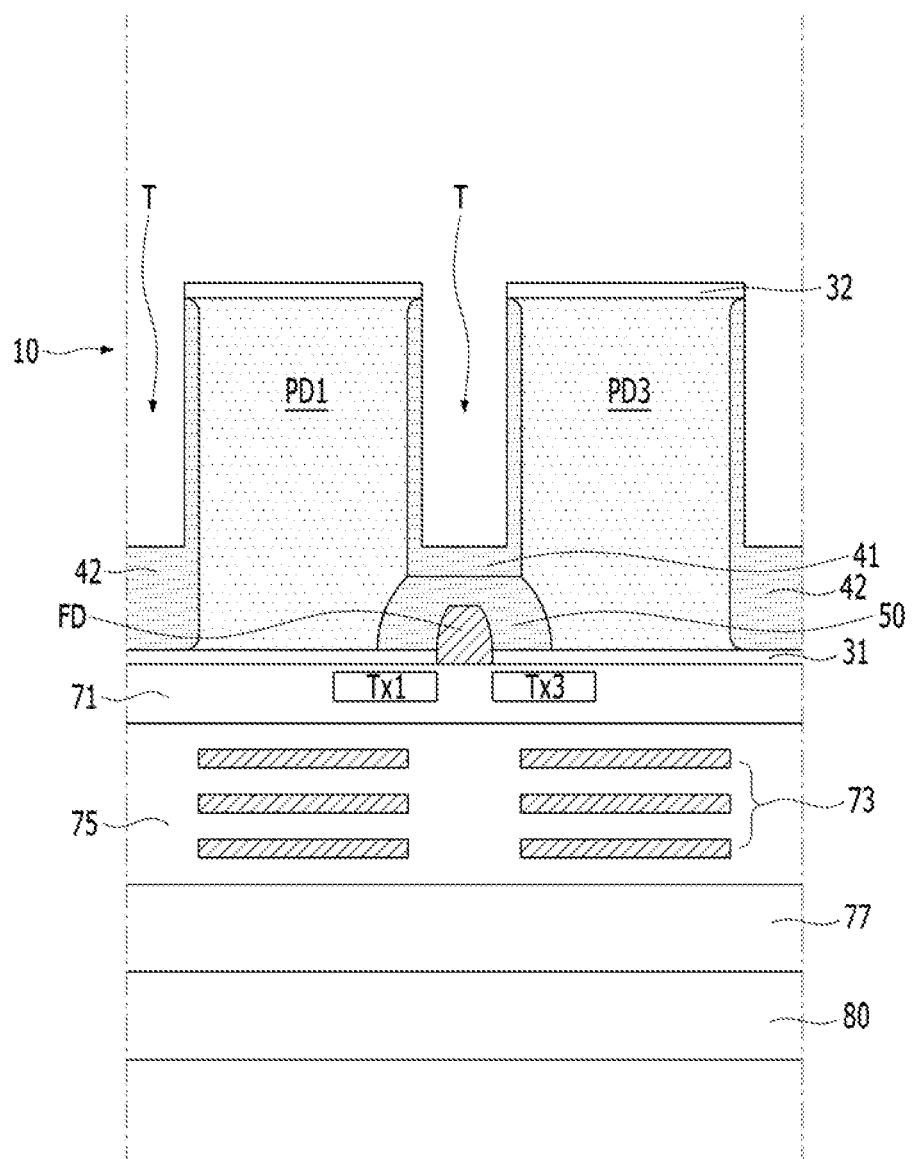

Referring to FIG. 5H, the method may include forming a deep trench T. The deep trench T may be arranged to overlap with the central and peripheral PD isolation regions 41 and 42. Specifically, the deep trench T may be formed within the central and peripheral PD isolation regions 41 and 42.

Figure 5I:
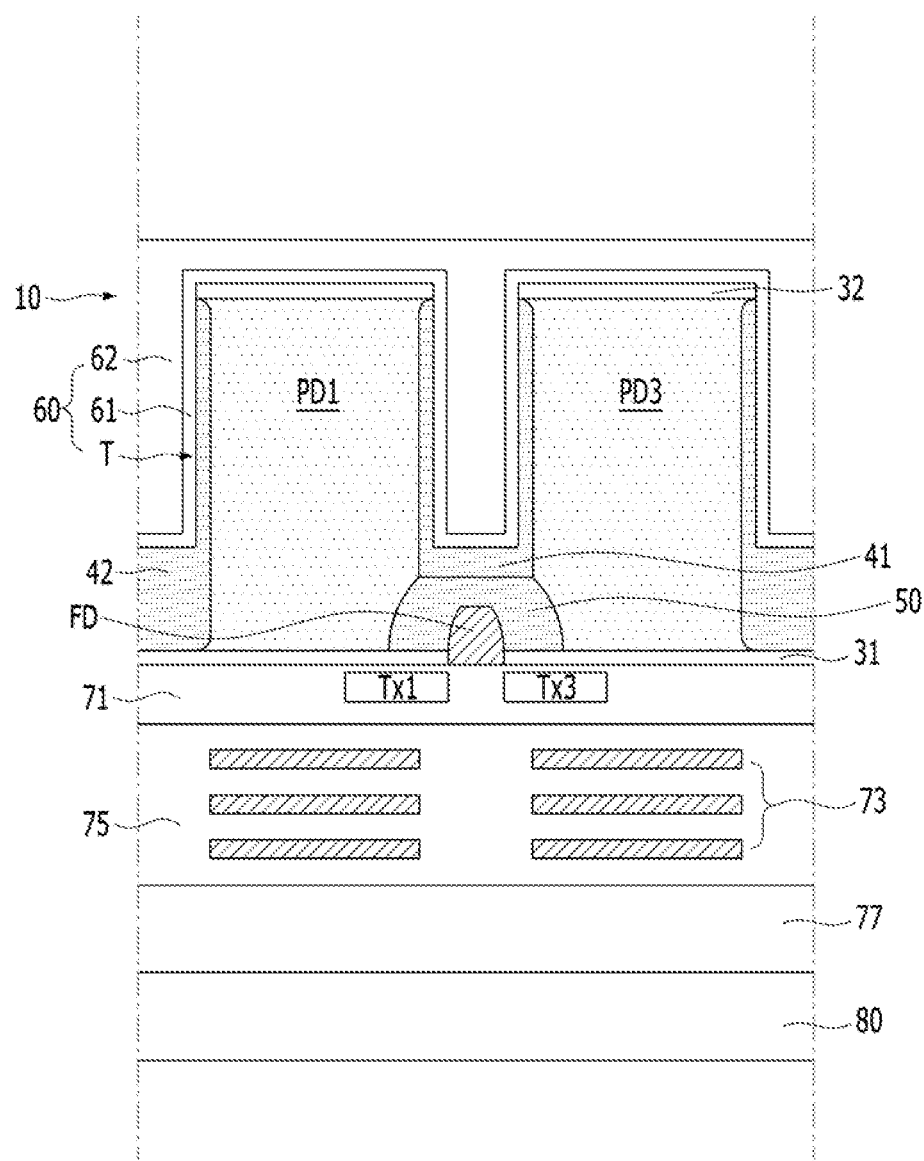

Referring to FIG. 5I, the method may include conformally depositing a lining insulating layer 61 in the deep trench T, and forming a trench isolation region 60 by filling a filling insulating layer 62. The lining insulating layer 61 may be conformably formed on the bottom surface and lateral walls of the deep trench T, and on the upper surface of the substrate 10. The filling insulating layer 62 may be formed to fill the deep trench T on the lining insulating layer 61. The upper surface of the filling insulating layer 62 may be planarized. For example, a chemical mechanical polishing (CMP) process may be performed. The lining insulating layer 61 may include a metallic oxide layer, such as a hafnium oxide ($HfO_2$), a hafnium silicon oxide ($Hf_xSi_yO_z$), a titanium dioxide ($TiO_2$), a zirconium oxide ($ZrO_2$), a magnesium oxide (MgO), a tantalum oxide ($Ta_2O_5$), a scandium oxide ($Sc_2O_3$), a ruthenium oxide ($Lu_2O_3$), an yttrium oxide ($Y_2O_3$), or a lanthanum oxide ($La_2O_3$), which has a high dielectric permittivity (high-k). When the lining insulating layer 61 includes a metallic oxide, positive holes generated in the PD regions PD1-PD4 can be drown and held.

In accordance with an embodiment, the lining insulating layer 61 may be formed in a double layer. For example, the lining insulating layer 61 may include: a first lining insulating layer including one selected from the group consisting of a hafnium oxide ($HfO_2$), a hafnium silicon oxide ($Hf_xSi_yO_z$), a titanium dioxide ($TiO_2$), a zirconium oxide ($ZrO_2$), a magnesium oxide (MgO), a tantalum oxide ($Ta_2O_5$), a scandium oxide ($Sc_2O_3$), a ruthenium oxide ($Lu_2O_3$), an yttrium oxide ($Y_2O_3$), and a lanthanum oxide ($La_2O_3$); and a second lining insulating layer including an aluminum oxide ($AL_2O_3$). The first lining insulating layer can efficiently hold positive holes generated in the PD regions PD1-PD4. The second lining insulating layer can protect the substrate 10 and the first lining insulating layer from moisture.

In accordance with an embodiment, the filling insulating layer 62 may additionally include a planarization insulating layer. Specifically, the method may additionally include, after filling the deep trench T, forming an insulating layer for planarization on the lining insulating layer 61 and/or planarizing the upper surface of the insulating layer for planarization.

Figure 5J:
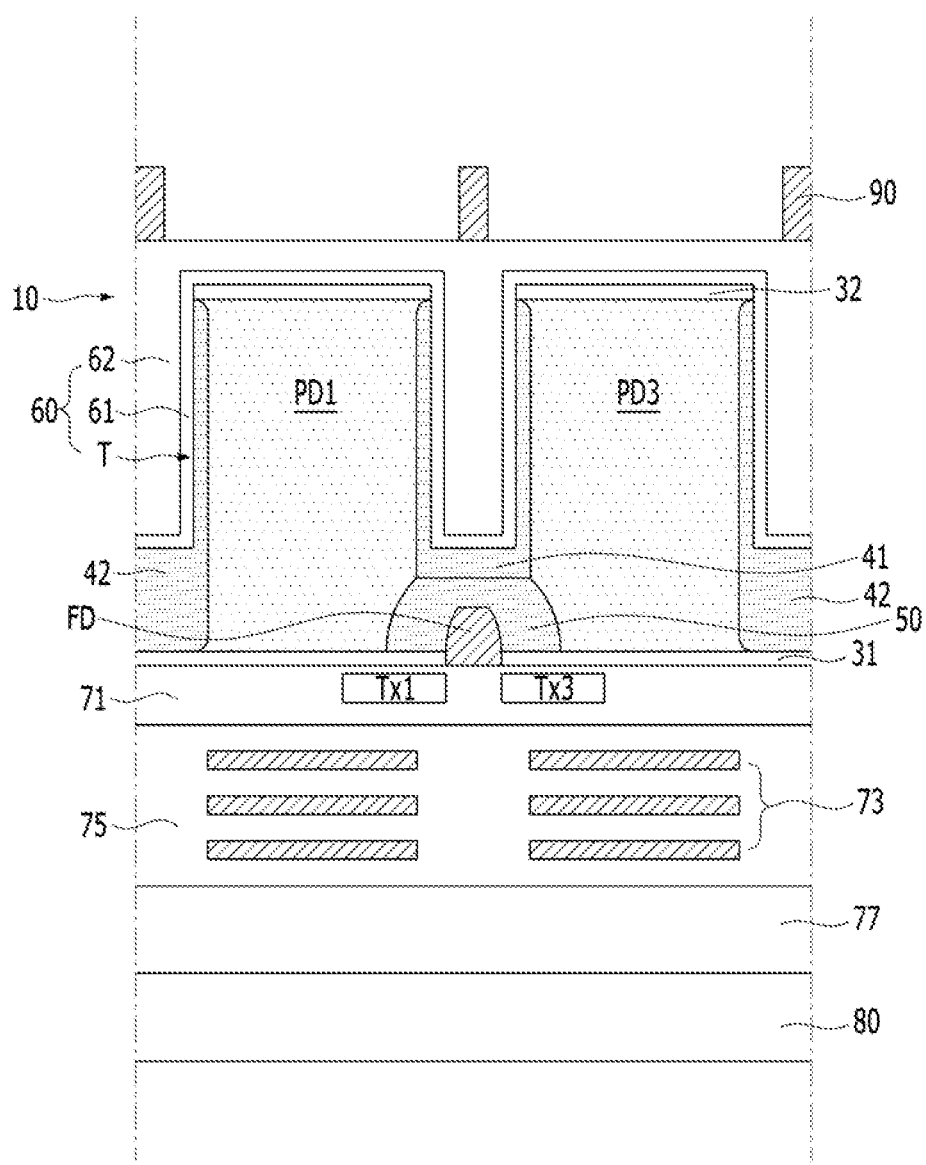

Referring to FIG. 5J, the method may include forming grid patterns 90 on the filling insulating layer 62 to be vertically aligned with the central and peripheral PD isolation regions 41 and 42 and/or the deep trench T. The grid patterns 90 may be formed to have the form of a lattice on a top view. Accordingly, the light-receiving regions of the PD regions PD1-PD4 can be defined by the grid patterns 90. The grid patterns 90 may include a metal such as tungsten (W).

Thereafter, referring to FIG. 3A, the method may include forming color filters CF between the grid patterns 90 to be aligned perpendicularly with the PD regions PD1-PD4, and forming micro-lenses ML on the color filters CF.

Figure 6A:
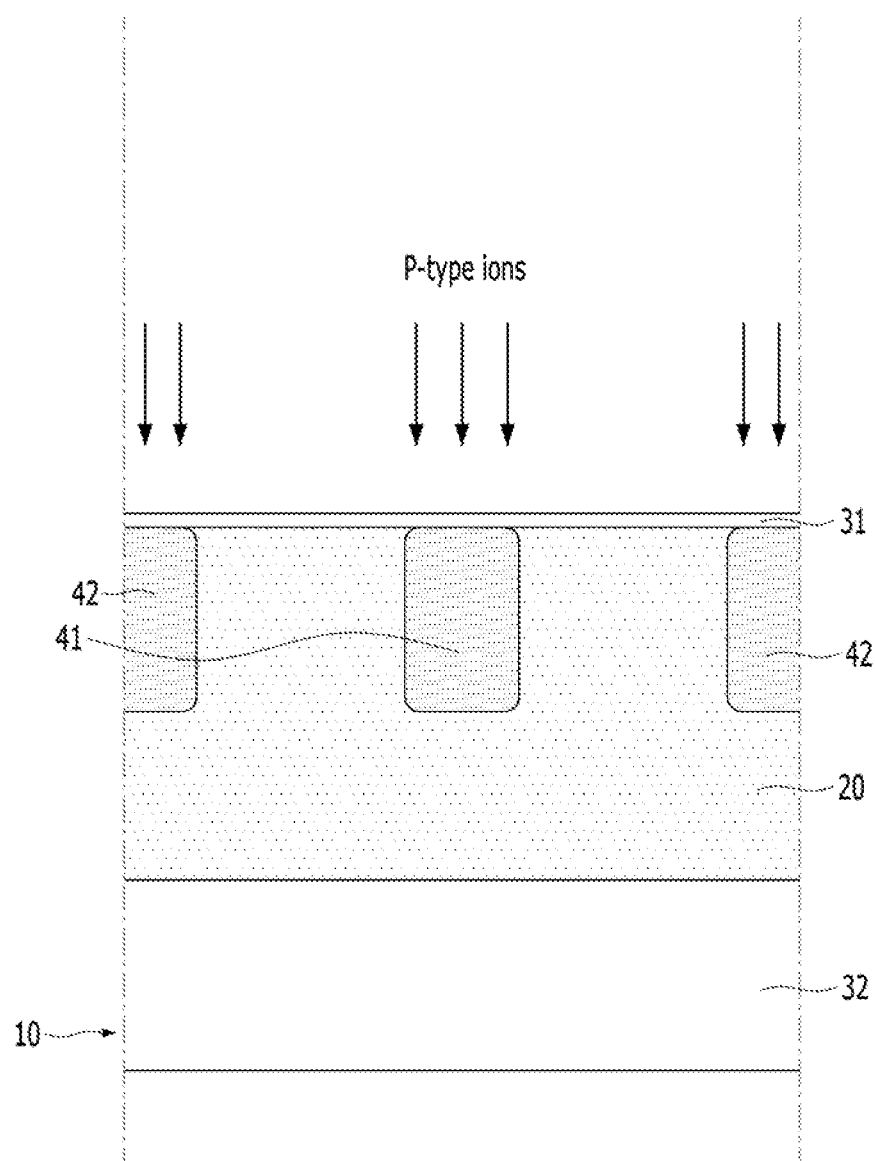
Figure 6B:
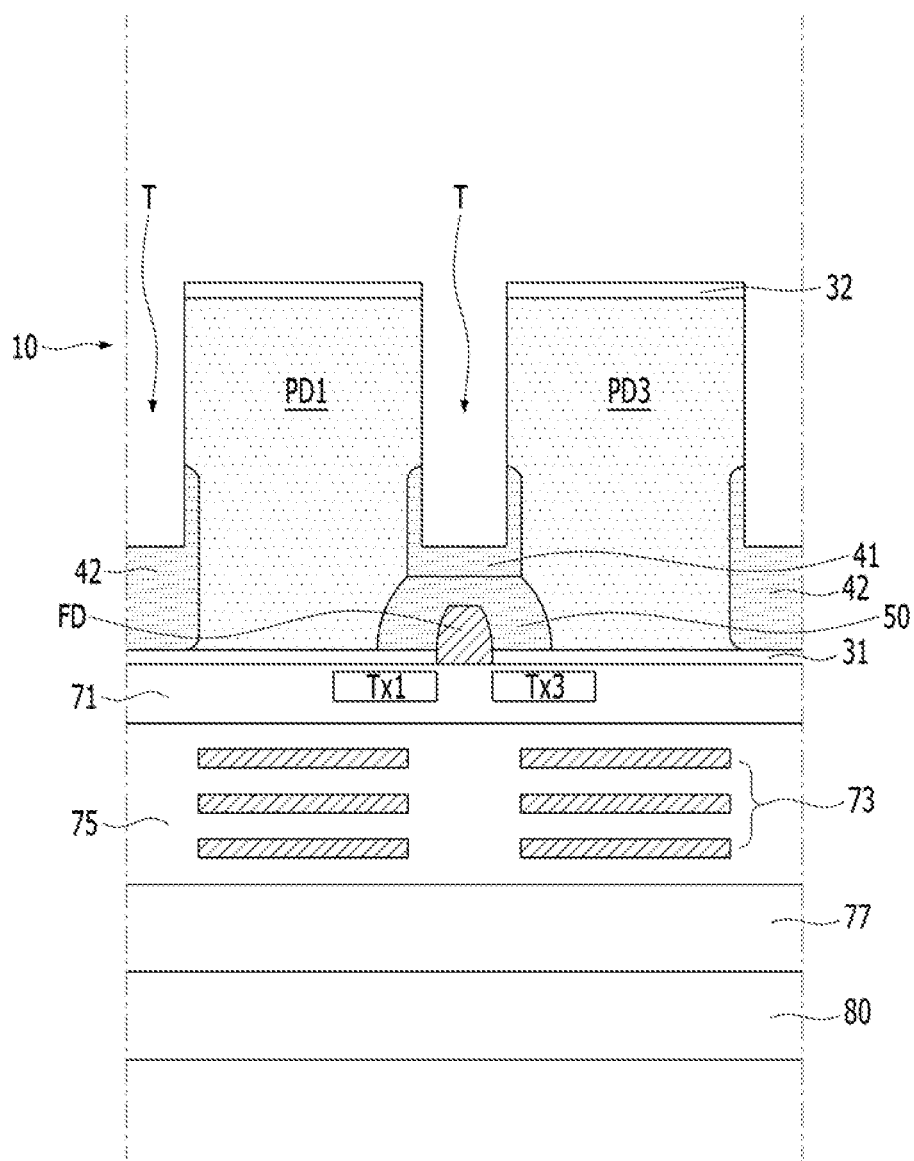
Figure 6C:
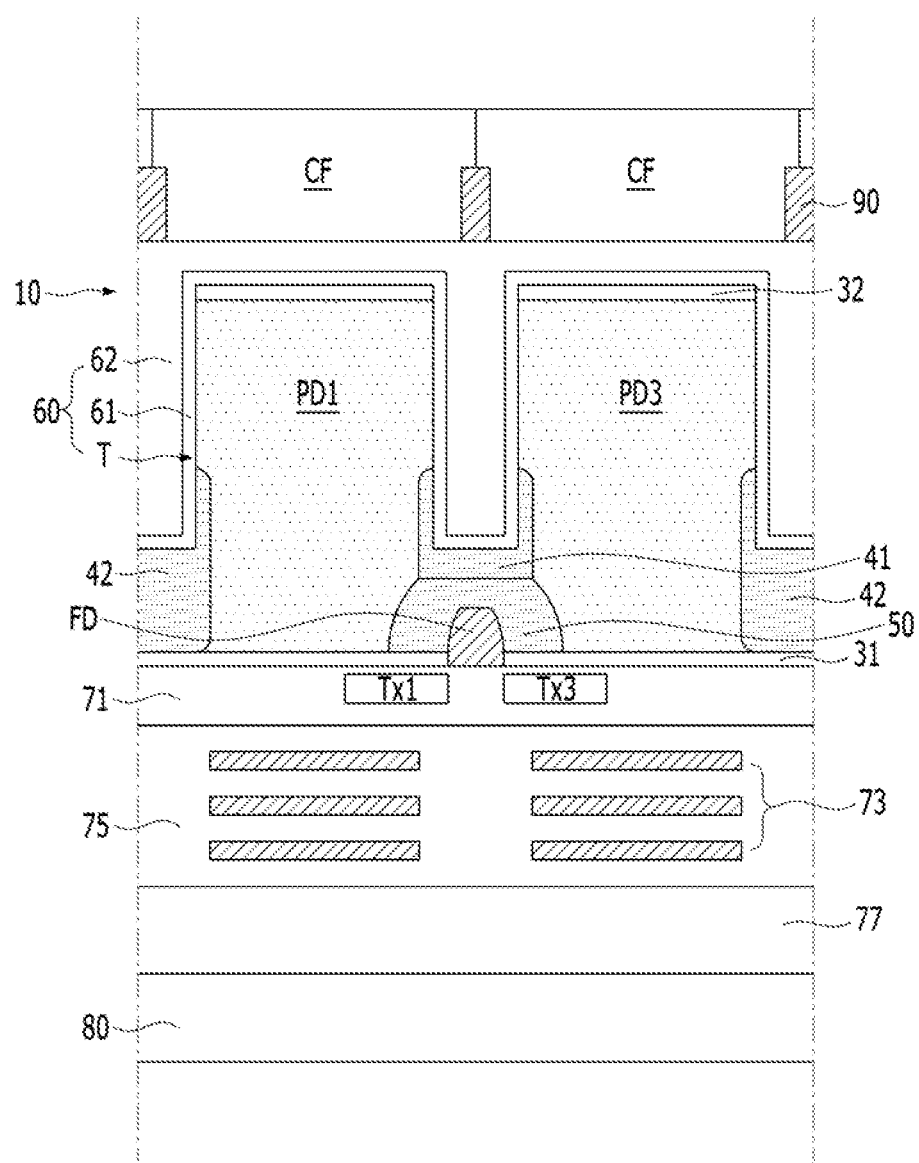

FIGS. 6A to 6C are longitudinal sectional views taken along line I-I' in FIG. 2A in order to explain a method for forming an image sensor in accordance with another exemplary embodiment of the present disclosure.

Referring to FIG. 6A, a method for forming an image sensor in accordance with an exemplary embodiment of the present disclosure may include, referring further to FIGS. 5A and 5B, forming an N-type doped region 20 and PD isolation regions 41 and 42 in a substrate 10. As compared with FIG. 5B, the PD isolation regions 41 and 42 may have a relatively shallow depth or a relatively short vertical length. That is to say, the lower region of the N-type doped region 20 may not be separated by the PD isolation regions 41 and 42.

Referring to FIG. 6B, the method may include forming a deep trench T arranged perpendicularly to align with the PD isolation regions 41 and 42 by performing the processes described with reference to FIGS. 5C to 5H. The deep trench T can separate the N-type doped region 20, which has not been separated, into first to fourth PD regions PD1-PD4.

Referring to FIG. 6C, the method may include forming deep trench isolation regions 60, forming grid patterns 90, and forming color filters CF by performing the processes described with reference to FIGS. 5I and 5J.

Thereafter, referring to FIG. 3B, the method may include forming micro-lenses ML.

Figure 7A:
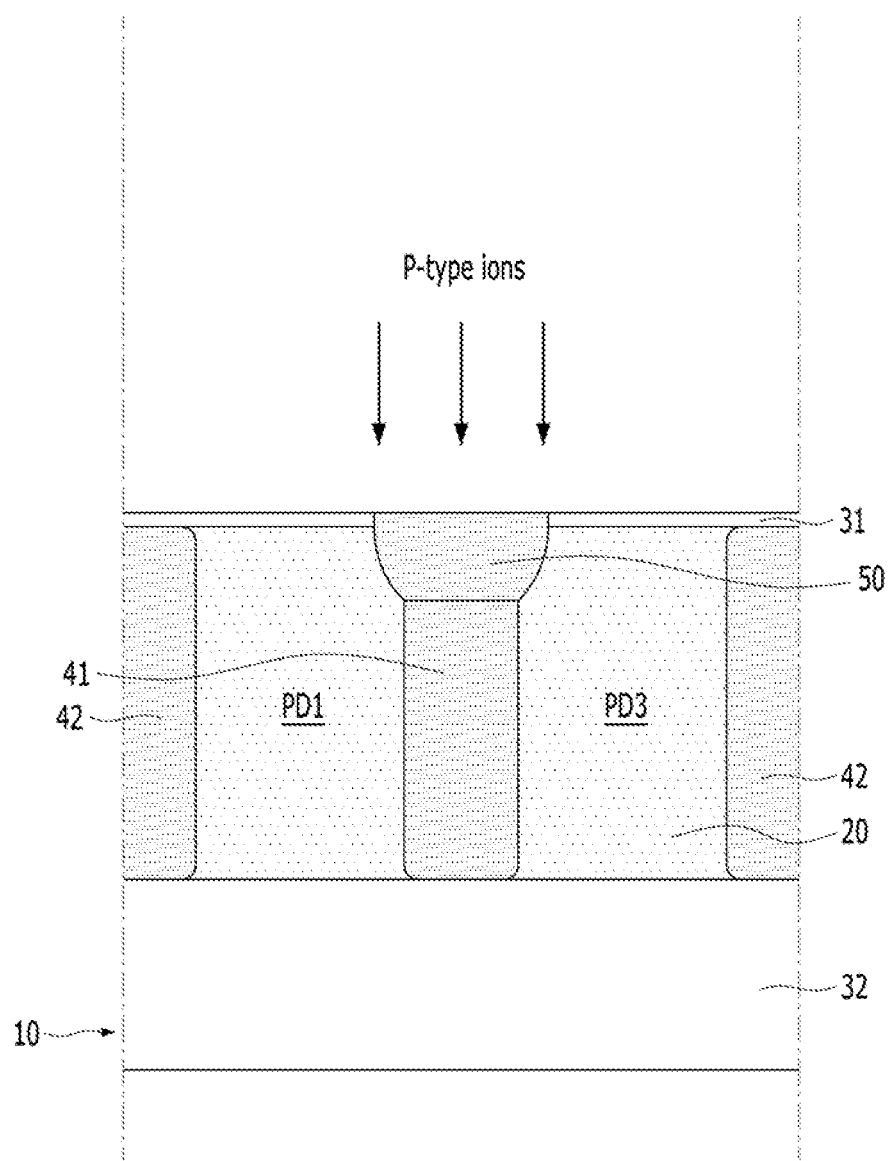
Figure 7B:
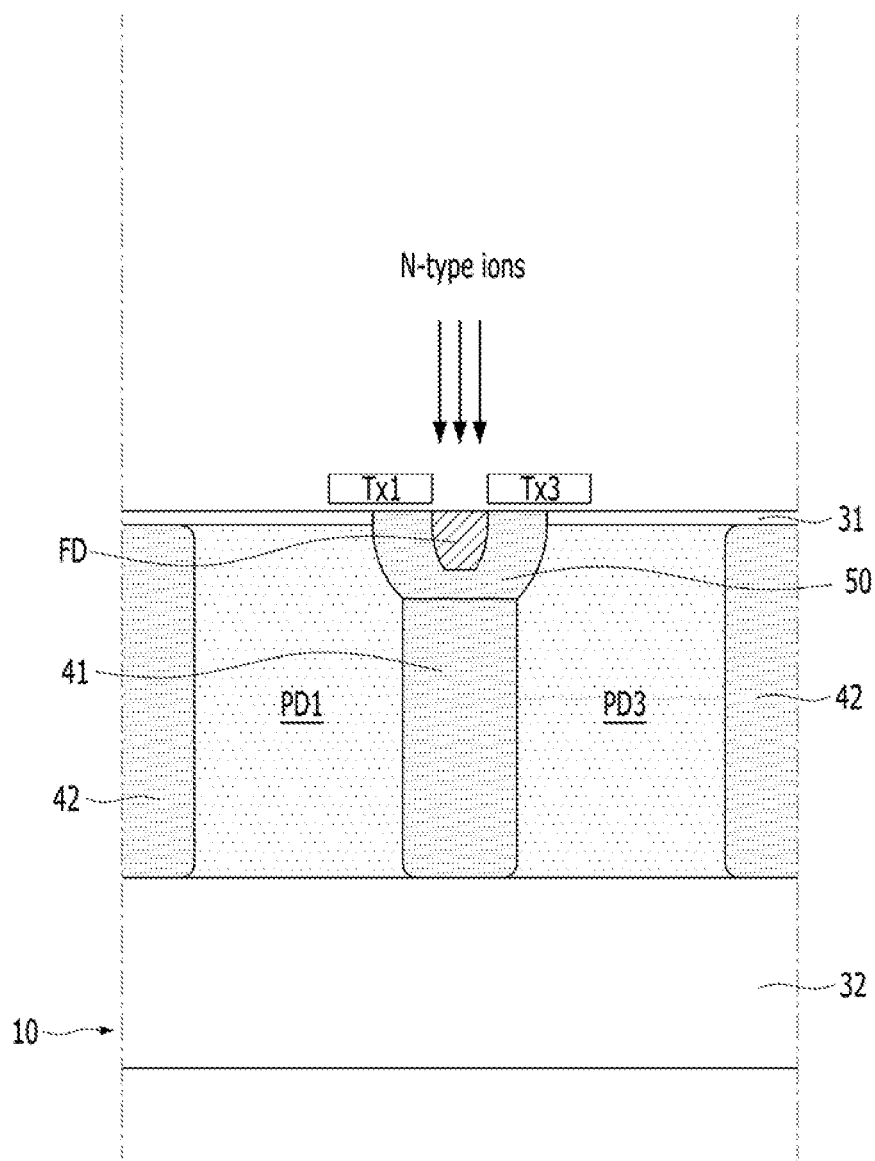

FIGS. 7A and 7B are longitudinal sectional views taken along line I-I' in FIG. 2A in order to explain a method for forming an image sensor in accordance with yet another exemplary embodiment of the present disclosure.

Referring to FIG. 7A, a method for forming an image sensor in accordance with an exemplary embodiment of the present disclosure may include, referring further to FIGS. 5A to 5C, forming an N-type doped region 20, PD isolation regions 41 and 42, and an FD isolation region 50 in a substrate 10. The upper portion of the FD isolation region 50 may be formed to abut on the upper surface of the substrate 10. That is to say, a first P-type doped region 31 may not exist between the FD isolation region 50 and the upper surface of the substrate 10.

Referring to FIG. 7B, the method may include, referring further to FIGS. 5D and 5E, forming transfer gates Tx1-Tx4 and a floating diffusion FD. An FD isolation region 50 may completely cover the lower surface and lateral walls of the floating diffusion FD. A part of the FD isolation region 50 adjacent to the lower surfaces of the transfer gates Tx1-Tx4 and the surface of the substrate 10 may be used as a channel region.

Thereafter, the method may include performing the processes described with reference to FIGS. 5F to 5J, and forming color filters CF and micro-lenses ML as described with reference to FIG. 3C.

Figure 8:
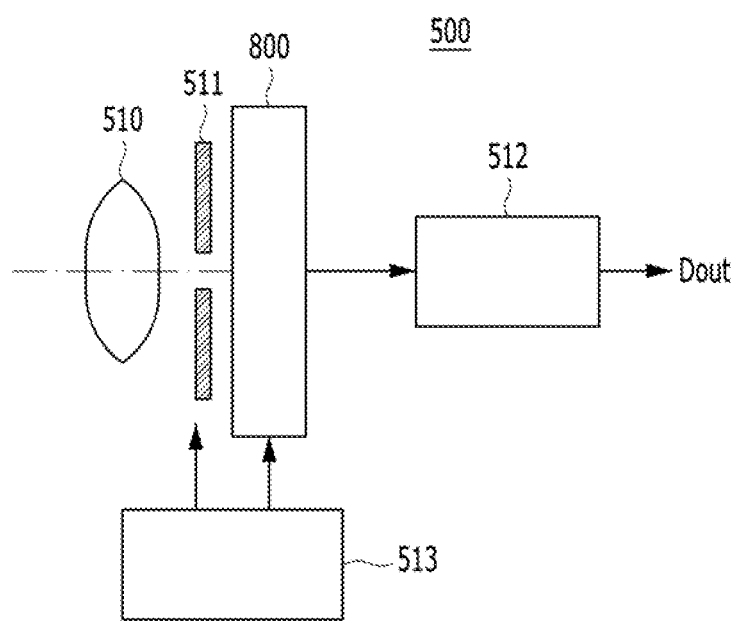
FIG. 8 is a diagram illustrating the configuration of an electronic device having an image sensor in accordance with an exemplary embodiment of the present disclosure.

FIG. 8 is a diagram illustrating the configuration of an electronic device 500 having an image sensor 800 in accordance with an exemplary embodiment of the present disclosure.

Referring to FIG. 8, an electronic device 500 having an image sensor 800 in accordance with an exemplary embodiment of the present disclosure may include a camera capable of photographing a still image or a moving image. The electronic device 500 may include an optical system (or an optical lens) 510, a shutter unit 511, a driving unit 513 for controlling/driving an image sensor 800 and the shutter unit 511, and a signal processing unit 512. The image sensor 800 may include one among the images sensors described in accordance with the various embodiments of the present disclosure.

The optical system 510 may guide image light (incident light) from a subject to a pixel array (see reference numeral "810" in FIG. 1) of the image sensor 800. The optical system 510 may include a plurality of optical lenses. The shutter unit 511 may control a light irradiation period and a light shielding period with respect to the image sensor 800. The driving unit 513 may control the transmission operation of the image sensor 800 and the shutter operation of the shutter unit 511. The signal processing unit 512 may perform various types of signal processing operations with respect to signals outputted from the image sensor 800. An image signal Dout, after the signal processing, may be stored in a storage medium such as a memory, or may be outputted to a monitor or the like.

According to the embodiments of the present disclosure, since the volumes of the photodiodes of pixels can be maximized, the entire well capacitance can increase. According to the embodiments of the present disclosure, since a channel region between a photodiode and a floating diffusion part can have a uniform channel length on the whole, lag on pixels can be reduced.

According to the inventive concept, in an aligned state in which the floating diffusion part, the FD isolation region, and the photodiodes are aligned, the channel lengths of the transfer gates, i.e. distances from the floating diffusion to the photodiodes, can be substantially uniform.

According to the inventive concept, in a misaligned state in which the floating diffusion, the FD isolation region, and the photodiodes are misaligned, the channel lengths of the transfer gates can be similar to each other.

Accordingly, the transfer characteristics of the transfer gates can be uniform, and the optical characteristic of the image sensor can be stable.

Other effects which are not directly mentioned, but which are obtained by various embodiments of the present disclosure are mentioned above.

Although preferred embodiments of the present disclosure have been described for illustrative purposes, those skilled in the art will appreciate that various modifications, additions and substitutions are possible, without departing from the scope and spirit of the disclosure as disclosed in the accompanying claims. Therefore, it should be appreciated that the embodiments described above are not limitative, but only illustrative.

What is claimed is:

1. An image sensor comprising:
a first PD isolation region suitable for determining first to fourth PD regions;
an FD isolation region formed between the first to fourth PD regions; and
a floating diffusion formed in the FD isolation region,
wherein the first PD isolation region is sitting over the floating diffusion with the FD isolation region disposed between the first PD isolation region and the floating diffusion,
wherein the first to fourth PD regions comprise first doped N-type ions,
wherein the first PD isolation regions comprise the first doped N-type ions and first doped P-type ions, and
wherein the FD isolation region is a P-type doped region to provide a channel region between the first to fourth PD regions and the floating diffusion, and
wherein the FD isolation region comprises the first doped N-type ions, the first doped P-type ions, and second doped P-type ions.

2. The image sensor of claim 1,
wherein a doping concentration of the first doped N-type ions is lower than a doping concentration of the first doped P-type ions.

3. The image sensor of claim 1,
wherein a doping concentration of the second doped P-type ions is higher than the doping concentration of the first doped P-type ions.

4. The image sensor of claim 1,
wherein the floating diffusion comprises the first doped N-type ions, the first doped P-type ions, second doped P-type ions, and second doped N-type ions.

5. The image sensor of claim 4,
wherein a doping concentration of the second doped N-type ions is higher than a doping concentration of the second doped P-type ions.

6. The image sensor of claim 1, further comprising:
first to fourth transfer gates vertically overlapped with parts of the FD isolation region and parts of the first to fourth PD regions, respectively, on a top view; and
a P-type doped region formed between the first to fourth transfer gates and the first to fourth PD regions,
wherein the P-type doped region vertically overlaps with the first to fourth transfer gates and the first to fourth PD regions.

7. The image sensor of claim 1, further comprising:
a PN junction between the FD isolation region and the floating diffusion,
wherein the FD isolation region and the floating diffusion comprise doped N-type ions and doped P-doped ions, in the FD isolation region, a doping concentration of the P-type ions is higher than a doping concentration of the N-type ions so that the FD isolation region is a P-type doped region, and in the floating diffusion, a doping concentration of the N-type ions is higher than a doping concentration of the P-type ions so that the floating diffusion is an N-type doped region.

8. An image sensor comprising:
first PD isolation regions between first to fourth PD regions to determine the first to fourth PD regions;
second PD isolation regions surrounding the first to fourth PD regions and the first PD isolation regions;
an FD isolation region surrounded by the first to fourth PD regions and the first PD isolation regions; and
a floating diffusion formed in the FD isolation region to be surrounded by the FD isolation region,
wherein the first PD isolation regions are sitting over the floating diffusion with the FD isolation region disposed between the first PD isolation regions and the floating diffusion,
wherein the first PD isolation regions include a first N-type ion concentration, and a first P-type ion concentration,
wherein the FD isolation region includes a second P-type ion concentration higher than the first P-type ion concentration of the first PD isolation regions, and
wherein the floating diffusion includes a second N-type ion concentration higher than the first N-type ion concentration and the second P-type ion concentration,
wherein the first to fourth PD regions comprise first doped N-type ions, and
wherein the first PD isolation regions comprise the first doped N-type ions and first doped P-type ions, and
wherein the FD isolation region comprises the first doped N-type ions, the first doped P-type ions, and second doped P-type ions.

9. The image sensor of claim 8,
wherein the floating diffusion comprises the first doped N-type ions, the first doped P-type ions, second doped P-type ions, and second doped N-type ions.

10. The image sensor of claim 8, further comprising:
a PN junction between the FD isolation region and the floating diffusion,
wherein the FD isolation region and the floating diffusion comprise doped N-type ions and doped P-doped ions, in the FD isolation region, a doping concentration of the P-type ions is higher than a doping concentration of the N-type ions so that the FD isolation region is a P-type doped region, and in the floating diffusion, a doping concentration of the N-type ions is higher than a doping concentration of the P-type ions so that the floating diffusion is an N-type doped region, and wherein the FD isolation region provide channel regions of the first to fourth transfer gates.

11. An image sensor comprising:

a PD isolation region suitable for determining first to fourth PD regions;

an FD isolation region formed between the first to fourth PD regions;

a floating diffusion formed in the FD isolation region, first to fourth transfer gates vertically overlapped with parts of the FD isolation region and parts of the first to fourth PD regions, respectively; and a P-type doped region formed between the first to fourth transfer gates and the first to fourth PD regions, wherein the P-type doped region vertically overlaps with the first to fourth transfer gates and the first to fourth PD regions, and wherein the PD isolation region is sitting over the floating diffusion with the FD isolation region disposed between the PD isolation region and the floating diffusion, wherein the FD isolation region provides channel regions of the first to fourth transfer gates, wherein the first to fourth PD regions comprise first doped N-type ions, and wherein the first PD isolation regions comprise the first doped N-type ions and first doped P-type ions, and wherein the FD isolation region comprises the first doped N-type ions, the first doped P-type ions, and second doped P-type ions.

12. The image sensor of claim 11, wherein second horizontal distances from the first interface to third interfaces between the FD isolation region and the PD isolation region are substantially equal to each other.

13. The image sensor of claim 12, wherein the first horizontal distances and the second horizontal distances are substantially equal to each other.

14. The image sensor of claim 11, wherein the floating diffusion comprises the first doped N-type ions, the first doped P-type ions, second doped P-type ions, and second doped N-type ions.

15. The image sensor of claim 11, further comprising:

a PN junction between the FD isolation region and the floating diffusion, wherein the FD isolation region and the floating diffusion comprise doped N-type ions and doped P-doped ions, in the FD isolation region, a doping concentration of the P-type ions is higher than a doping concentration of the N-type ions so that the FD isolation region is a P-type doped region, and in the floating diffusion, a doping concentration of the N-type ions is higher than a doping concentration of the P-type ions so that the floating diffusion is an N-type doped region.

* * * * *